United States Patent
Iwanari et al.

(10) Patent No.: US 8,422,267 B2
(45) Date of Patent: Apr. 16, 2013

(54) SEMICONDUCTOR MEMORY DEVICE AND SEMICONDUCTOR INTEGRATED CIRCUIT

(75) Inventors: Shunichi Iwanari, Kyoto (JP); Yasuo Murakuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/243,312

(22) Filed: Sep. 23, 2011

(65) Prior Publication Data
US 2012/0075905 A1 Mar. 29, 2012

Related U.S. Application Data

(63) Continuation of application No. PCT/JP2009/007102, filed on Dec. 22, 2009.

(30) Foreign Application Priority Data

May 26, 2009 (JP) .................................. 2009-126244

(51) Int. Cl.
*G11C 11/22* (2006.01)
(52) U.S. Cl.
USPC ......................................... 365/145; 365/205
(58) Field of Classification Search .................. 365/145, 365/205
See application file for complete search history.

(56) References Cited

U.S. PATENT DOCUMENTS

| | | | |
|---|---|---|---|
| 6,256,702 B1 | 7/2001 | Yoneyama | |
| 6,288,930 B1 | 9/2001 | Takeshima et al. | |
| 2004/0184307 A1 | 9/2004 | Saito | |
| 2007/0053220 A1 | 3/2007 | Gohou | |
| 2008/0291766 A1* | 11/2008 | Bessho et al. | 365/230.03 |

FOREIGN PATENT DOCUMENTS

| | | |
|---|---|---|
| JP | 06-052697 | 2/1994 |
| JP | 08-185694 | 7/1996 |
| JP | 11-096781 | 4/1999 |
| JP | 2001-057096 | 2/2001 |
| JP | 2001-084760 | 3/2001 |
| JP | 2001-189082 | 7/2001 |
| JP | 2004-288282 | 10/2004 |
| JP | 2007-073141 | 3/2007 |

* cited by examiner

*Primary Examiner* — Michael Tran
(74) *Attorney, Agent, or Firm* — McDermott Will & Emery LLP

(57) ABSTRACT

A semiconductor memory device includes a plurality of memory cells connected to a common bit line, a plurality of select lines each configured to select at least one of the memory cells, a plurality of drive circuits each configured to drive at least one of the select lines, a sense amplifier configured to amplify a voltage occurring at the bit line depending on data stored in the selected memory cell. A memory region where the memory cells are provided has a first region and a second region. When the first region is read, a larger number of the select lines are simultaneously driven by the corresponding common drive circuit than those in the second region, and a larger number of the memory cells are simultaneously selected than those in the second region.

21 Claims, 16 Drawing Sheets

READ OPERATION WAVEFORM

NORMAL REGION

HIGHLY RELIABLE REGION
CONNECTED USING DIFFUSION LAYER

HIGHLY RELIABLE REGION CONNECTED USING ELECTRODES

NORMAL REGION

HIGHLY RELIABLE REGION
CONNECTED USING DIFFUSION LAYER

FIG.17

| REGION | W or R | VDD1 | VDD2 | VDD3 | VPP |
|---|---|---|---|---|---|
| NORMAL REGION | W/R | NORMAL | NORMAL | NORMAL | NORMAL |
| HIGHLY RELIABLE | W | NORMAL | LOW VOLTAGE | HIGH VOLTAGE | HIGH VOLTAGE |
| | R | NORMAL | LOW VOLTAGE | HIGH VOLTAGE | HIGH VOLTAGE |

SEMICONDUCTOR MEMORY DEVICE AND SEMICONDUCTOR INTEGRATED CIRCUIT

CROSS-REFERENCE TO RELATED APPLICATIONS

This is a continuation of PCT International Application PCT/JP2009/007102 filed on Dec. 22, 2009, which claims priority to Japanese Patent Application No. 2009-126244 filed on May 26, 2009. The disclosures of these applications including the specifications, the drawings, and the claims are hereby incorporated by reference in their entirety.

BACKGROUND

The present disclosure relates to semiconductor memory devices, such as non-volatile semiconductor memory devices etc., and more particularly, to ferroelectric random access memory (FeRAM) devices which can store data after being subjected to, for example, a high-temperature thermal treatment, and semiconductor integrated circuits including FeRAM devices.

In recent years, attention has been paid to non-volatile semiconductor memory, such as ferroelectric random access memory (FeRAM or FRAM), erasable and programmable read only memory (EPROM), electrical erasable and programmable read only memory (EEPROM), etc.

For these memory devices, the microfabrication techniques have been advanced, the memory capacity has been increased, and the voltage has been lowered. Therefore, the amount of charge stored per bit has decreased. The stored charge amount further decreases under a high-temperature environment etc., so that stored data may fail to be read out.

Conventional memory devices have addressed the failure or error by error detection using data duplication or parity checking, error correction using a majority decision circuit or an ECC circuit, etc.

Japanese Patent Publication No. H11-96781 describes a conventional technique relating to the present disclosure, and more specifically, a semiconductor memory device in which a particular one(s) of a plurality of memory sectors is set as a highly reliable region. When write operation is performed in the region, two or more memory cells are simultaneously written. When read operation is performed, the memory cells which have been simultaneously written are simultaneously read.

Due to this, the number of times the non-volatile semiconductor memory device can be rewritten can be increased, and the decrease in cell current can be reduced even if the storage time is elongated. In this technique, the cell currents of memory cells are added together. The size of the memory sector in the highly reliable region is externally adjusted.

Here, the simultaneous write/read control of two or more memory cells and the adjustment of the memory sector size are performed by changing the logic process of an address signal input to an address decoder.

Japanese Patent Publication No. 2007-073141 describes another conventional technique relating to the present disclosure, and more specifically, a semiconductor memory in which regions having different specifications are provided in a memory region, and one of the regions is selected, depending on the desired specifications.

In the above technique, the memory region including the same cells is separated into a first memory region which operates in a volatile mode and a second memory region which operates in a non-volatile mode, depending on the specifications of timing of internal operation. An operation control circuit controls the time during which a voltage is applied to a plate line, based on a signal output from an operation switching circuit, to select the first memory region (volatile mode operation) or the second memory region (non-volatile mode operation), which is then accessed.

Japanese Patent Publication No. H06-52697 also describes a conventional technique relating to the present disclosure, and more specifically, a semiconductor memory device with an error correction function. The semiconductor memory device includes memory cell array sections including an odd number of three or more memory cells, and majority decision circuits for the respective memory cell array sections, thereby correcting an error in a memory cell.

However, in Japanese Patent Publication No. H11-96781, two or more memory cells are simultaneously selected by changing the logic process of an address signal input to an address decoder. Therefore, a decoding circuit is required in order to provide such an address decoding function, resulting in an increase in the size of the decoding circuit.

In Japanese Patent Publication No. 2007-073141, data write/read operation is performed on single-bit memory cells. Therefore, a data storage characteristic is determined based on a characteristic of a memory cell which is a 1-bit unit, and therefore, in particular, data loss caused by stress (a high-temperature treatment etc.) after storage of data cannot be avoided only by switching timing specifications (data which can be correctly read out cannot be ensured).

Moreover, in Japanese Patent Publication No. H06-52697, error detection can correct only correctable errors.

Error correction for multiple bits requires a complicated circuit for error correction.

The semiconductor memory device with an error correction function of Japanese Patent Publication No. H06-52697 requires memory cell array sections including an odd number of three or more memory cells, and majority decision circuits for the respective memory cell array sections.

SUMMARY

The present disclosure describes implementations of, for example, a technique of providing a highly reliable data storage region having a small area and increasing the read margin of the region.

An example semiconductor memory device of the present disclosure includes a plurality of memory cells connected to a common bit line, a plurality of select lines each configured to select at least one of the memory cells, a plurality of drive circuits each configured to drive at least one of the select lines, and a sense amplifier configured to amplify a voltage occurring at the bit line depending on data stored in the selected memory cell. A memory region where the memory cells are provided has a first region and a second region. When the first region is read, a larger number of the select lines are simultaneously driven by the corresponding common drive circuit than those in the second region, and a larger number of the memory cells are simultaneously selected than those in the second region. The voltage occurring at the common bit line depending on data stored in the simultaneously selected memory cells is amplified by the sense amplifier.

Another example semiconductor memory device of the present disclosure includes a plurality of memory cells connected to a common bit line, a plurality of select lines each configured to select at least one of the memory cells, a plurality of drive circuits each configured to drive at least one of the select lines, and a sense amplifier configured to amplify a voltage occurring at the bit line depending on data stored in the selected memory cell. A memory region where the memory cells are provided has a first region and a second region. When the first region is read, a larger number of the memory cells connected to the common bit line are selected by a single one of the select lines driven by the corresponding drive circuit than those in the second region. The voltage occurring at the common bit line depending on data stored in the simultaneously selected memory cells is amplified by the sense amplifier.

Still another example semiconductor memory device of the present disclosure includes a plurality of memory cells connected to a common bit line, a plurality of select lines each configured to select at least one of the memory cells, and a plurality of drive circuits each configured to drive at least one of the select lines. A memory region where the memory cells are provided has a first region and a second region. The semiconductor memory device further includes a first and a second sense amplifier corresponding to the first and second regions, respectively, where the first and second sense amplifiers are each configured to amplify a voltage occurring at the bit line depending on data stored in the selected memory cell. The first and second sense amplifiers have different amplification capabilities.

According to the present disclosure, for example, the following advantages are obtained.

1) By providing a method for selecting a plurality of cells so that the same data is written to and read from the cells in order to increase the amount (voltage) of data read from the highly reliable region, the decoding circuit can be reduced, and the area of a region where data is not lost due to high-temperature treatment stress can be reduced.

2) By handling read data (signal) from a plurality of cells each having the same size as that of a normal cell as if the read data were one read from one cell, in order to increase the amount (voltage) of data read from the highly reliable region, variations in cell characteristic can be reduced, and the load of an operating circuit can be reduced, whereby a stable read data amount (voltage) can be ensured and the power consumption can be reduced.

3) By sensing read data (voltage) from the highly reliable region with high sensitivity, the increase in the area of the sense amplifier can be minimized, and particularly, the read margin of the highly reliable region can be increased, whereby a smaller area and higher reliability can be ensured.

4) In a semiconductor integrated circuit including the semiconductor memory device and a power supply potential generation circuit, by optimizing a supply potential, depending on the operating region of the memory circuit, the amount of charge stored in the highly reliable region of the memory circuit, and the amount of read charge, can be increased.

BRIEF DESCRIPTION OF THE DRAWINGS

FIG. 17 is a diagram for describing an example power supply voltage supplied to each part.

DETAILED DESCRIPTION

Figure 1:
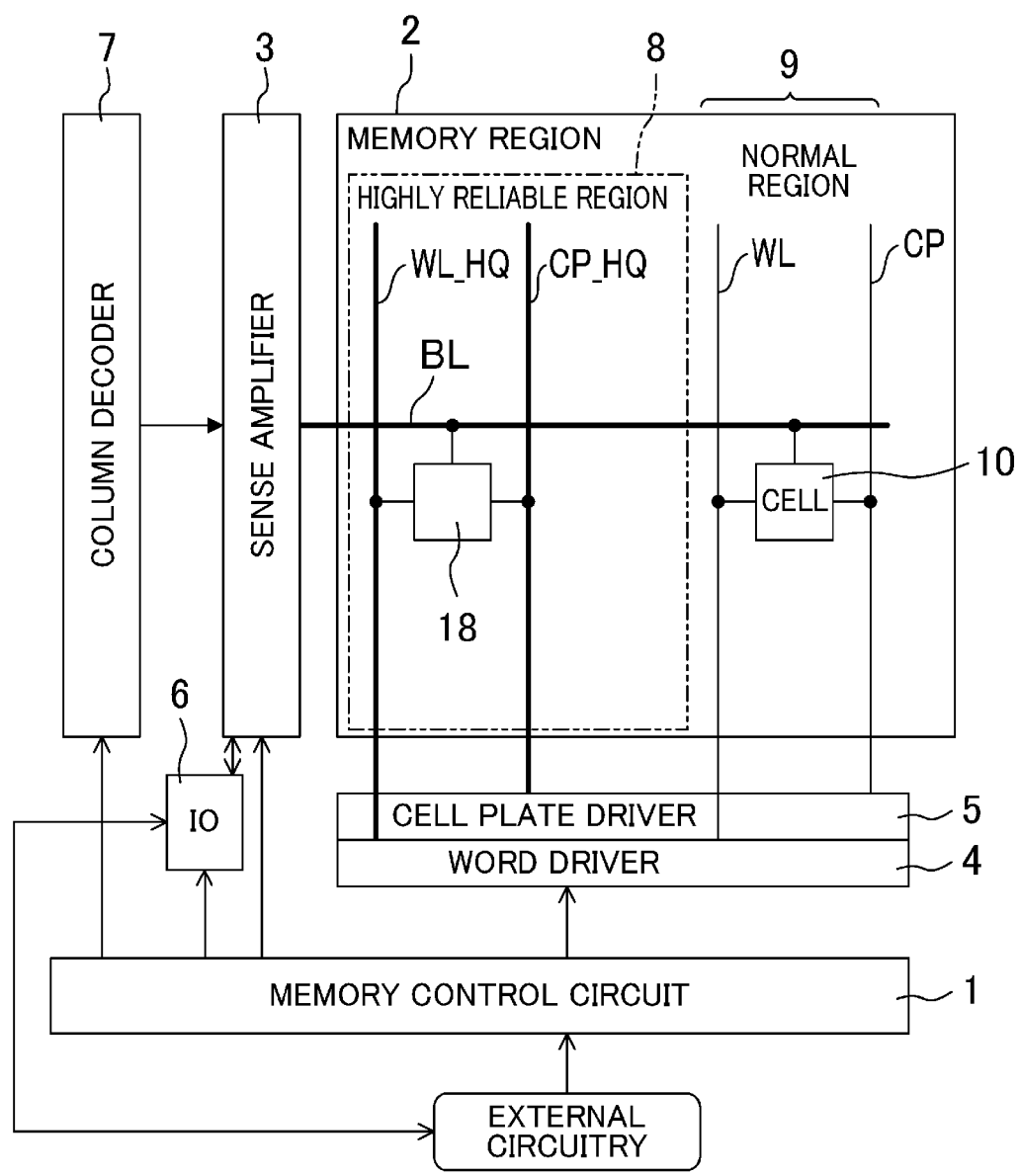
FIG. 1 is a block diagram schematically showing a configuration of an FeRAM device according to a first embodiment.

Embodiments of the present disclosure will be described hereinafter with reference to the accompanying drawings. In the embodiments below, the same or similar parts are identified by the same reference characters and the description thereof will not be repeated.

First Embodiment of the Present Disclosure

Firstly, a configuration according to a first embodiment of the present disclosure will be described.

FIG. 1 shows a configuration of functional blocks of an FeRAM device according to the first embodiment of the present disclosure.

The FeRAM device of this embodiment includes a memory control circuit 1 (including an address input circuit), a memory region 2, sense amplifiers 3, a word driver 4, a cell plate driver 5, an I/O circuit 6, and a column decoder 7.

The memory region 2 includes ferroelectric memory cells (hereinafter referred to as "memory cells") 10 and 18 arranged in a matrix.

In particular, the memory region 2 has a highly reliable region 8 and a normal region 9.

Next, operation in this embodiment will be described.

Firstly, data write operation in this embodiment will be described.

Initially, the memory control circuit 1 generates an activation signal based on an external input command and address, and outputs the activation signal to the word driver 4 and the cell plate driver 5. The word driver 4 outputs signals WL and WL_HQ to word lines WL and WL_HQ. The cell plate driver 5 outputs signals CP and CP_HQ to cell plate lines CP and CP_HQ. Memory cells 10 and 18 are selected based on the signals WL and WL_HQ and the signals CP and CP_HQ.

Previously written data is read out as voltages from the selected memory cells 10 and 18 and output to bit lines BL, and then transferred to sense amplifiers 3 connected to the bit lines BL. The sense amplifiers 3 amplify the voltages and hold the amplified voltages as read data.

On the other hand, external input write data is transferred via the I/O circuit 6 to a sense amplifier 3 selected by the column decoder 7 based on an input address, so that previously stored read data is replaced with the external input write data. Thereafter, the write data is transferred and written via a bit line BL to memory cells 10 and 18.

Next, data read operation in this embodiment will be described.

Initially, the memory control circuit 1 generates an activation signal based on an external input command and address, and outputs the activation signal to the word driver 4 and the cell plate driver 5. The word driver 4 outputs signals WL and WL_HQ. The cell plate driver 5 outputs signals CP and CP_HQ. Memory cells 10 and 18 are selected based on the signals WL and WL_HQ and the signals CP and CP_HQ. Previously written data is read out as voltages from the selected memory cells 10 and 18 and output to bit lines BL, and then transferred to sense amplifiers 3 connected to the bit lines BL. The sense amplifiers 3 amplify the voltages, and stores the amplified voltages as read data.

Next, a sense amplifier 3 is selected by the column decoder 7 based on an input address. The selected sense amplifier 3 transfers the stored read data to the I/O circuit 6. The read data is output via the I/O circuit 6 to external circuitry.

Figure 2:
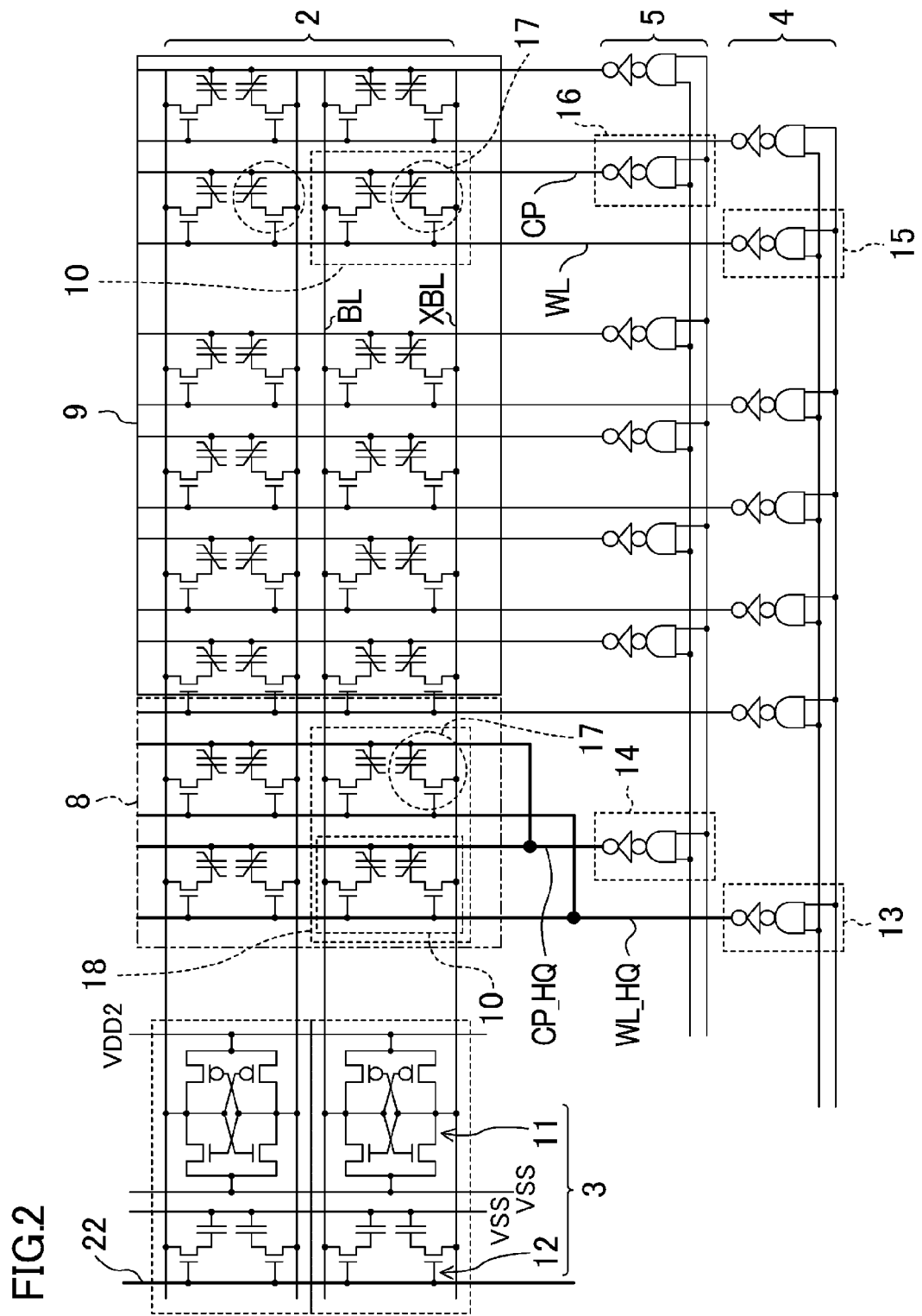
FIG. 2 is a circuit diagram showing a specific configuration of the FeRAM device of FIG. 1.

FIG. 2 shows a detailed configuration of the memory region 2, the sense amplifiers 3, the word driver 4, and the cell plate driver 5 of FIG. 1.

The sense amplifiers 3 each include an amplifier circuit 11 which amplifies the potential (data) of a bit line BL connected thereto. The sense amplifier 3 further includes an additional capacitor, a capacitor addition switch 12 for connecting the additional capacitor to the bit line BL, and a capacitor addition switch select line 22, in order to switch the parasitic capacitances of the bit line BL so that the different parasitic capacitances are added to the different regions, i.e., the highly reliable region 8 and the normal region 9 of the memory region 2.

In the highly reliable region 8 of the memory region 2, one word driver 13 is provided for each word. In the highly reliable region 8, one word line WL_HQ (a word line for the highly reliable region 8) connected to the output (output node) of each word driver 13 is branched into two word lines WL_HQ for selecting memory cells 18. Similarly, one cell plate driver 14 is provided for each cell plate line CP_HQ (a cell plate line for the highly reliable region 8) for selecting memory cells 18. In the highly reliable region 8, one cell plate line CP_HQ connected to the output of each cell plate driver 14 is branched into two cell plate lines CP_HQ for selecting memory cells 18.

On the other hand, in the normal region 9 of the memory region 2, one word driver 15 is provided for each word. One word line WL (a word line for the normal region 9) for selecting memory cells 10 is connected to the output of each word driver 15. Similarly, one cell plate line CP (a cell plate line for the normal region 9) for selecting memory cells 10 is connected to the output of each cell plate driver 16.

Figure 3:
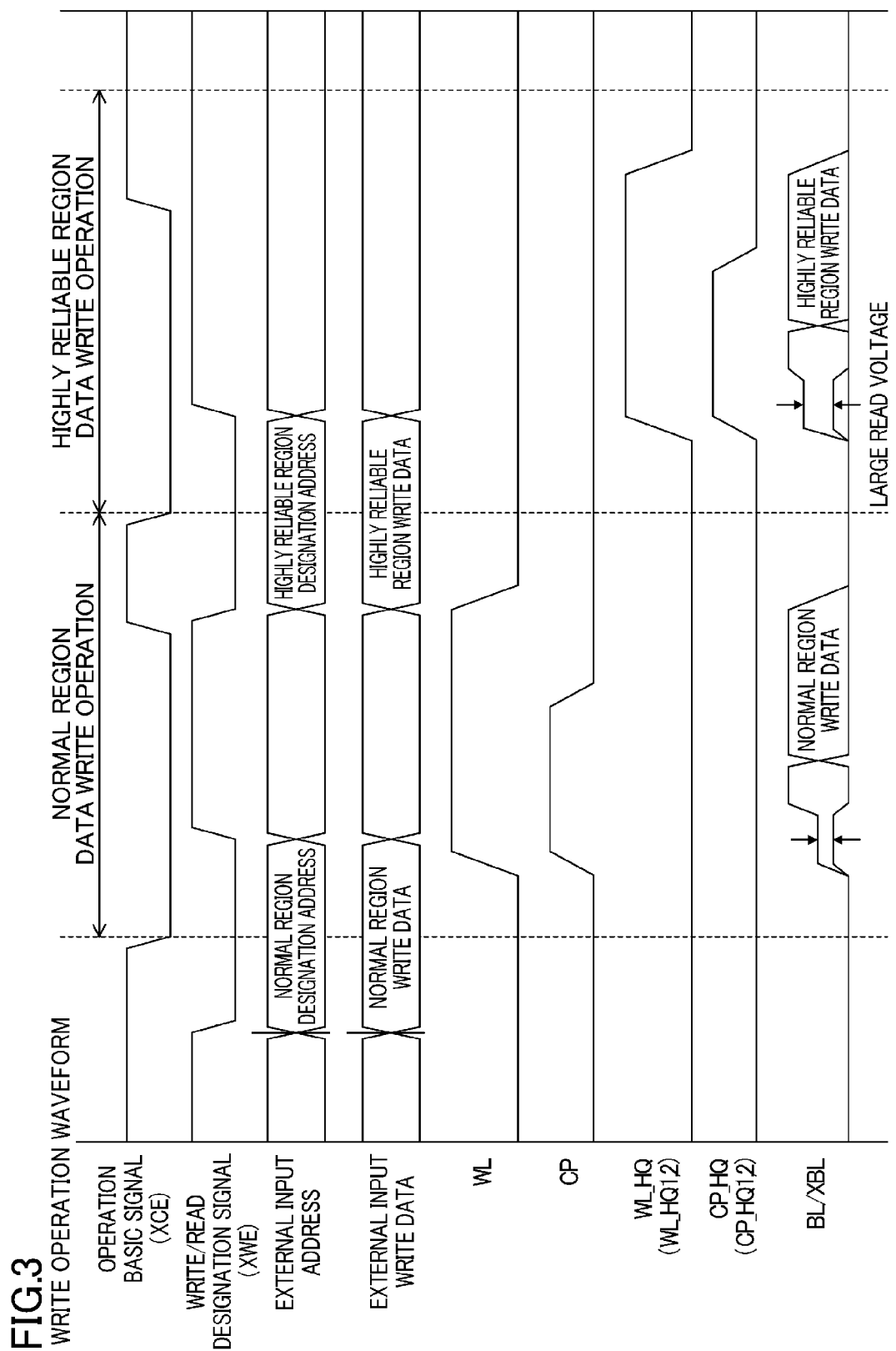
FIG. 3 is a timing chart showing write operation of the FeRAM device of FIG. 1.

Next, data write operation in the normal region 9 and the highly reliable region 8 of the configuration of FIG. 2 will be described with reference to FIG. 3.

When the normal region 9 is selected based on an external input address, a word driver 15 and a cell plate driver 16 for the normal region 9 are activated to output a signal WL and a signal CP. Based on the signals WL and CP, a group of memory cells 10 connected to the word line WL and the cell plate line CP is selected. Each memory cell 10 includes two cells 17 which store 1-bit data in a complementary fashion (one cell connected to a bit line BL and the other cell connected to a complementary bit line XBL). Only one memory cell 10 which stores 1-bit data in a complementary fashion is selected for each bit line pair BL (bit lines BL and XBL). External input data is transferred to a sense amplifier 3, and written via a bit line pair BL to a selected memory cell 10.

When the highly reliable region 8 is selected based on an external input address, a word driver 13 and a cell plate driver 14 for the highly reliable region 8 are activated to output a signal WL_HQ and a signal CP_HQ. Based on the signals WL_HQ and CP_HQ, one memory cell (a memory cell in the highly reliable region 8) 18 is selected for each bit line pair BL (bit lines BL and XBL).

Each memory cell 18 in the highly reliable region 8 includes a plurality of (here, two) memory cells 10 which are similar to those of the normal region 9. Each memory cell 10 includes two cells 17. The memory cell 18 also stores 1-bit data in a complementary fashion (one cell connected to a bit line BL and the other cell connected to a complementary bit line XBL).

In other words, in the highly reliable region 8, a plurality of memory cells 10 are simultaneously selected for each bit line pair BL (bit lines BL and XBL). External input data is transferred to a sense amplifier 3, and written via a bit line pair BL to a selected memory cell 18. Specifically, the same data is written to the memory cells 10 which are connected to each bit line pair BL (bit lines BL and XBL) and have been simultaneously selected.

Figure 4:
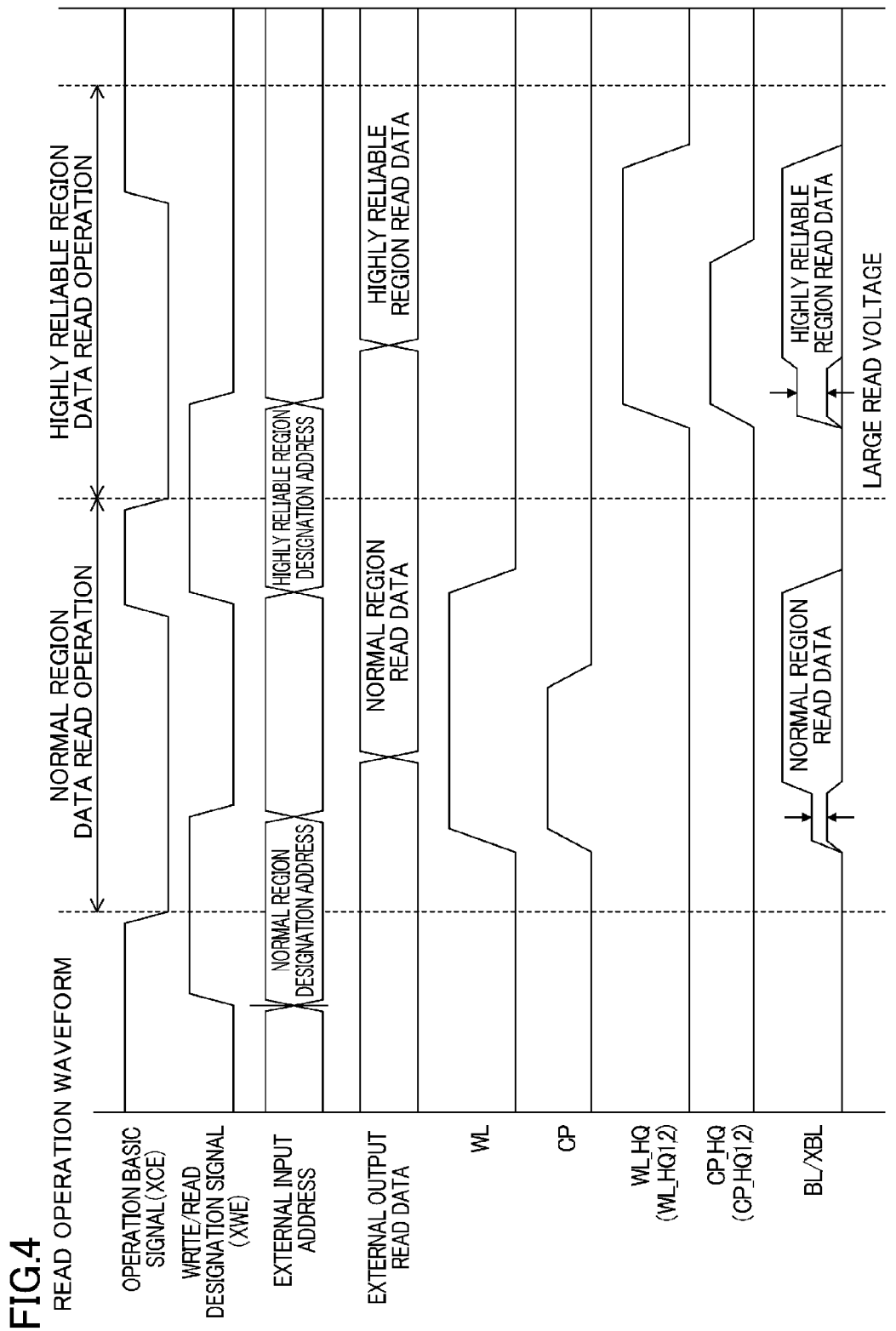
FIG. 4 is a timing chart showing read operation of the FeRAM device of FIG. 1.

Next, data read operation in the normal region 9 and the highly reliable region 8 of the configuration of FIG. 2 will be described with reference to FIG. 4.

When the normal region 9 is selected based on an external input address, a word driver 15 and a cell plate driver 16 in the normal region 9 are activated to output a signal WL and a signal CP. Based on the signals WL and CP, a group of memory cells 10 connected to a word line WL and a cell plate line CP is selected. Stored complementary data is read, as a voltage corresponding to one cell, from the selected memory cells 10 to bit lines BL and XBL connected to thereto.

When the highly reliable region 8 is selected based on an external input address, a word driver 13 and a cell plate driver 14 for the highly reliable region 8 are activated to output a signal WL_HQ and a signal CP_HQ. Based on the signals WL_HQ and CP_HQ, a group of memory cells 18 each including a plurality of memory cells 10 is selected. Specifically, a plurality of memory cells 10 are simultaneously selected for each bit line pair BL, and stored data is read and output, as the sum (combination) of voltages corresponding to the memory cells 10, to the bit lines BL and XBL connected to the memory cells 18.

When the highly reliable region 8 is selected and data is read from a group of memory cells 18 each including a plurality of memory cells 10 and output to bit lines BL and XBL, a read voltage (potential difference) from each memory cell 18 is maximized by increasing the parasitic capacitances of the bit lines BL and XBL by turning on the capacitor addition switches 12 for connecting the additional capacitors in the sense amplifier 3 to the bit lines BL and XBL using the capacitor addition switch select line 22.

As a result, for example, even after a high-temperature thermal treatment (i.e., even if the treatment decreases stored data), a sufficient amount of data to be sensed by the sense amplifier 3, i.e., a read voltage, can be ensured.

In this configuration, particularly, one word driver 13 is used to drive two word lines WL, thereby selecting memory cells 18 each including a plurality of memory cells 10. Similarly, one cell plate driver 14 is used to drive two cell plate lines CP, thereby selecting a plurality of memory cells 18. Therefore, a reduction in area and power consumption due to a reduction in circuit size, and the provision of the highly reliable region 8, can be easily simultaneously achieved.

Note that, here, each memory cell 10 includes two cells 17 and stores 1-bit data in a complementary fashion (one cell connected to a bit line BL and the other cell connected to a complementary bit line XBL). Alternatively, each memory cell 10 may include a single cell 17 and may not store 1-bit data in a complementary fashion. In other words, although each memory cell described above is of the 2T2C (two transistors and two capacitors) type, each memory cell may be of the 1T1C (one transistor and one capacitor) type. In the latter case, read voltages in data read operation can also be summed, and therefore, similar advantages can be obtained.

Variation of First Embodiment of the Present Disclosure

Figure 5:
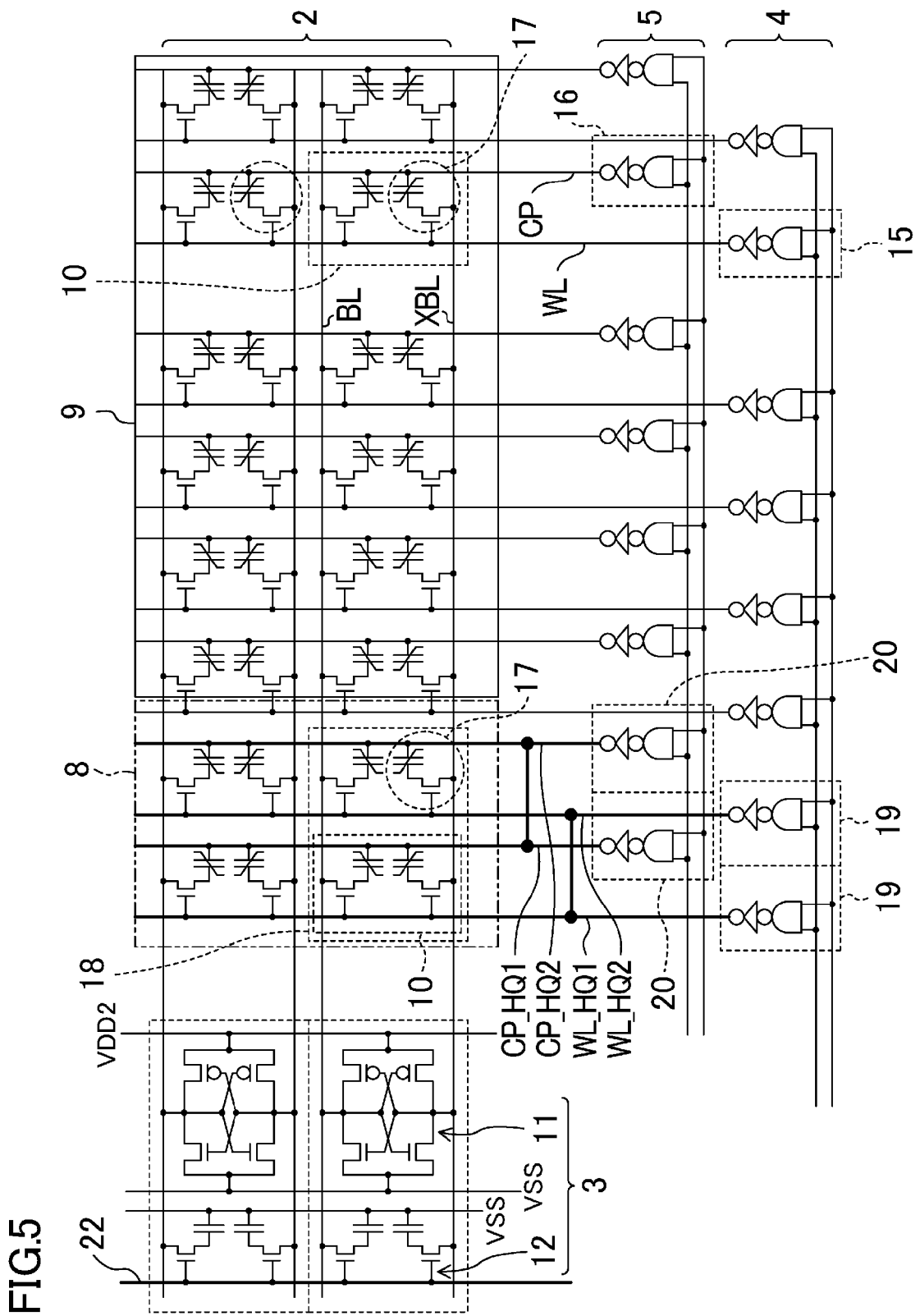
FIG. 5 is a circuit diagram showing a specific configuration of a variation of the first embodiment.

FIG. 5 shows a detailed configuration of the memory region 2, the sense amplifiers 3, the word driver 4, and the cell plate driver 5 of FIG. 1, similar to FIG. 2.

In the highly reliable region 8 of the memory region 2, two word drivers 19 are provided for each word. Two word lines WL for selecting memory cells 18 are connected to the respective word drivers 19, and are connected to each other. Similarly, for two cell plate lines CP for selecting memory cells 18, two cell plate drivers 20 are provided. The two cell plate lines CP for selecting memory cells 18 are connected to the respective cell plate drivers 20, and are connected to each other.

On the other hand, in the normal region 9 of the memory region 2, similar to FIG. 2, one word line WL for selecting memory cells 10 is provided for each word and is connected to each word driver 15. Similarly, one cell plate line CP for selecting memory cells 10 is connected to each cell plate driver 16.

Next, data write operation in the normal region 9 and the highly reliable region 8 of the configuration of FIG. 5 will be described with reference to FIG. 3.

Write operation performed when the normal region 9 is selected based on an external input address is exactly the same as that of the first embodiment.

When the highly reliable region 8 is selected based on an external input address, two word drivers 19 and two cell plate drivers 20 in the highly reliable region 8 are activated to output signals WL_HQ1 and WL_HQ2 and signals CP_HQ1 and CP_HQ2. The signals WL_HQ1 and WL_HQ2 and the signals CP_HQ1 and CP_HQ2 are transferred via word lines WL_HQ1 and WL_HQ2 connected to each other and cell plate lines CP_HQ1 and CP_HQ2 connected to each other, respectively, to select memory cells (memory cells in the highly reliable region 8) 18. Operation of writing external input data to the selected memory cells 18 is the same as that of the first embodiment.

Next, data read operation in the normal region 9 and the highly reliable region 8 of the configuration of FIG. 5 will be described with reference to FIG. 4.

Read operation performed when the normal region 9 is selected based on an external input address is exactly the same as that of the first embodiment.

When the highly reliable region 8 is selected based on an external input address, similar to the write operation, memory cells (memory cells in the highly reliable region 8) 18 are selected based on signals WL_HQ1 and WL_HQ2 output from two word drivers 19 in the highly reliable region 8 and signals CP_HQ1 and CP_HQ2 output from two cell plate drivers 20 in the highly reliable region 8. Operation of reading data stored in the selected memory cells 18 is the same as that of the first embodiment.

The capacitor addition switch 12 is controlled in the same manner as that of the first embodiment.

As a result, also, for example, even after a high-temperature thermal treatment (i.e., even if the treatment decreases stored data), a sufficient amount of data to be sensed by the sense amplifier 3, i.e., a read voltage, can be ensured.

Note that the word lines WL_HQ are connected to each other and the cell plate lines CP_HQ are connected to each other in FIGS. 2 and 5. This connection may be made using a single diffusion layer or a plurality of diffusion layers.

Second Embodiment of the Present Disclosure

Firstly, a configuration according to a second embodiment of the present disclosure will be described.

Figure 6:
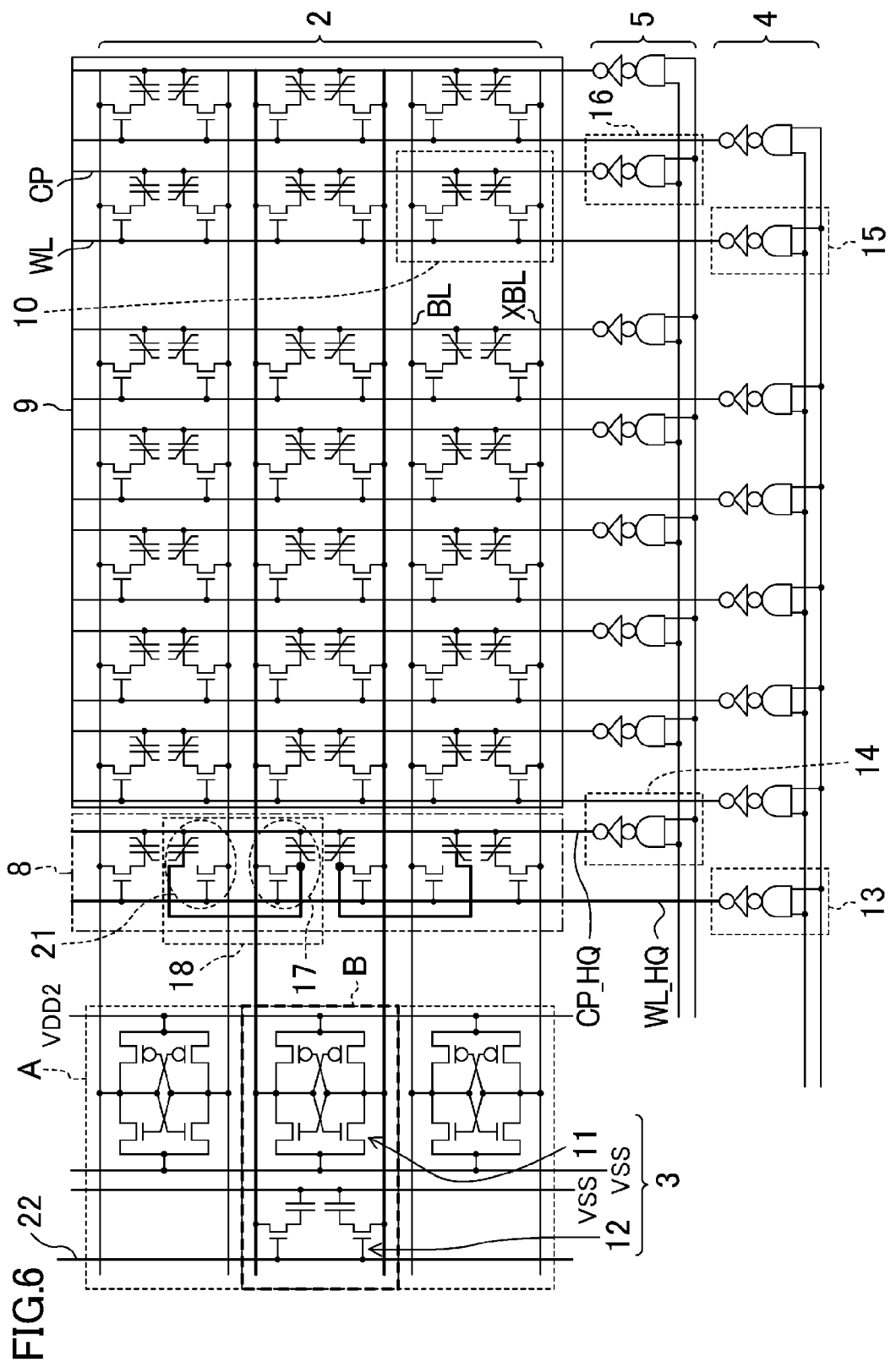
FIG. 6 is a circuit diagram showing a detailed configuration of an FeRAM device according to a second embodiment.

FIG. 6 shows a detailed configuration of the memory region 2, the sense amplifiers 3, the word driver 4, and the cell plate driver 5 of FIG. 1.

The sense amplifiers 3 each include an amplifier circuit 11 which amplifies the potential (data) of a bit line BL connected thereto. The sense amplifier 3 further includes an additional capacitor, a capacitor addition switch 12 for connecting the additional capacitor to the bit line BL, and a capacitor addition switch select line 22, in order to switch the parasitic capacitances of the bit line BL so that the different parasitic capacitances are added to the different regions, i.e., the highly reliable region 8 and the normal region 9 of the memory region 2.

This embodiment is different from the first embodiment in a technique of selecting a memory cell in the highly reliable region 8.

In this embodiment, one word driver 15 or 13 is provided for each word in both the normal region 9 and the highly reliable region 8 of the memory region 2. In the normal region 9 and the highly reliable region 8, a single word line WL or WL_HQ connected to the output of the word driver 15 or 13 is used to select memory cells 10 or 18. Similarly, for cell plate lines CP for selecting memory cells 10 or 18, one cell plate driver 16 or 14 is provided for each word. In the normal region 9 and the highly reliable region 8, a single cell plate line CP or CP_HQ connected to the output of the cell plate driver 16 or 14 is used to select memory cells 10 or 18.

Here, in the memory cell 18 of the highly reliable region 8, charge accumulators of a cell 17 and a cell 21 adjacent to each other along the word line WL_HQ and the cell plate line CP_HQ are directly connected together without a switch being connected therebetween.

Figure 7:
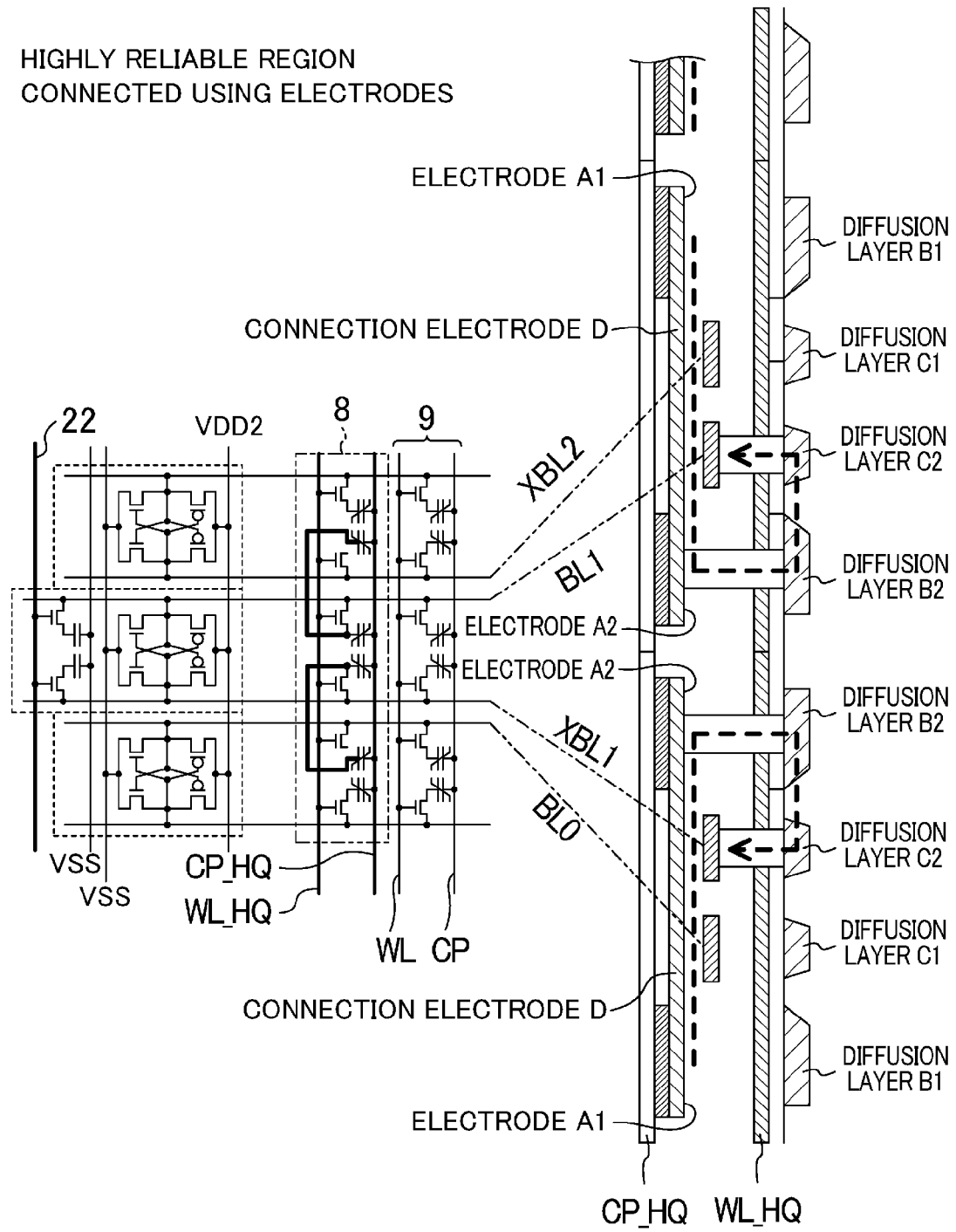
FIG. 7 is a cross-sectional view showing an interconnection structure of a highly reliable region in the FeRAM device of FIG. 6.
Figure 8:
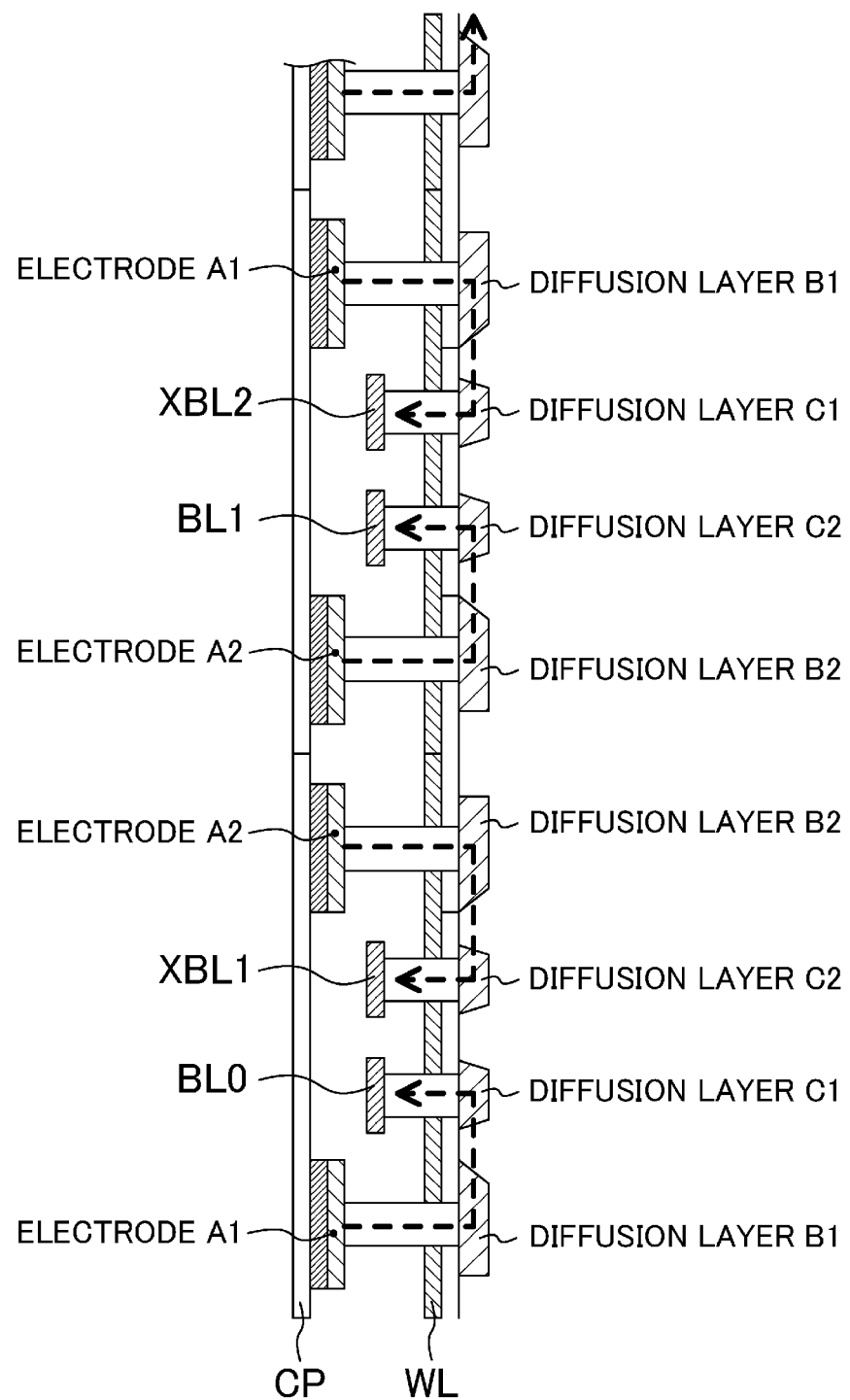
FIG. 8 is a cross-sectional view showing an interconnection structure of a normal region in the FeRAM device of FIG. 6.

FIG. 7 shows a cross-sectional structure of the memory cell 18 having the direct connection. The charge accumulators of the adjacent cells 17 and 21 in the highly reliable region 8 include electrodes A2 and A1 which are connected to each other via a connection electrode D. Specifically, in the normal region 9, the electrodes A2 and A1 are not connected to each other in the structure of the adjacent cells 17 and 21 as shown in FIG. 8, while, in the highly reliable region 8, the memory cell electrodes are shared by the adjacent cells and are connected to each other. Note that paths through which charge is transferred to bit lines BL are indicated by dashed arrow lines in FIG. 8.

When the normal region 9 is selected, as shown in FIG. 8 the electrodes A1 included in the charge accumulators are connected via diffusion layers B1 and C1 (transistors) to the bit lines XBL2 and BL0. The electrodes A2 included in the charge accumulators of other cells are connected via diffusion layers B2 and C2 (transistors) to the bit lines BL1 and XBL1.

On the other hand, when the highly reliable region 8 is selected, the electrodes A2 and A1 are connected via the common diffusion layers B2 and C2 (transistors) to the bit lines BL1 and XBL1 because the electrodes A2 and A1 are connected to each other via the connection electrode D.

Next, data write operation in the normal region 9 and the highly reliable region 8 of the configuration of FIGS. 6-8 will be described.

Write operation performed when the normal region 9 is selected based on an external input address is exactly the same as that of the first embodiment.

When the highly reliable region 8 is selected based on an external input address, one word driver 13 and one cell plate driver 14 in the highly reliable region 8 are activated to output signals WL_HQ and CP_HQ. Based on the signals WL_HQ and CP_HQ, memory cells 18 are selected.

External input data is transferred to a sense amplifier 3, and written via a bit line pair BL to a selected memory cell 18. In the memory cell 18 of the highly reliable region 8, two cells 17 and 21 adjacent to each other along the word line WL_HQ and the cell plate line CP_HQ are connected to each other as described above. In other words, data is written to the memory cell 18 having a capacitance corresponding to the sum of the capacitances of a plurality of cells (in this case, the same data is written to a plurality of cells 17 and 21 which are connected to the respective bit line pairs BL (bit lines BL and XBL) and are simultaneously selected).

Here, the number of sense amplifiers 3 operated differs between when the normal region 9 is selected and when the highly reliable region 8 is selected. When the normal region 9 is selected, sense amplifiers 3 (A and B in FIG. 6) are operated in a block-by-block basis (each block is selected in the memory region 2). When the highly reliable region 8 is selected, only one (B in FIG. 6) of sense amplifiers 3 in a selected block of the memory region 2 that is connected to a bit line BL connected to a memory cell 18 to which cells 17 and 21 are connected via a word line WL_HQ and a cell plate line CP_HQ, is operated for data write and read operation.

Next, data read operation in the normal region 9 and the highly reliable region 8 of the configuration of FIGS. 6-8 will be described.

Read operation performed when the normal region 9 is selected based on an external input address is exactly the same as that of the first embodiment.

When the highly reliable region 8 is selected based on an external input address, one word driver 13 and one cell plate driver 14 in the highly reliable region 8 are activated to output signals WL_HQ and CP_HQ. As a result, a memory cell 18 having a capacitance corresponding to the sum of the capacitances of a plurality of cells is selected, and data stored in the memory cell 18 is read and output, as the sum of the voltages of the cells, to bit lines BL and XBL connected to the memory cell 18.

Here, the capacitor addition switch 12 is controlled in the same manner as that of the first embodiment.

As a result, for example, even if a high-temperature thermal treatment decreases stored data, a sufficient amount of data to be sensed by the sense amplifier 3, i.e., a read voltage, can be ensured.

In this configuration, particularly, the memory cell 18 includes the two cells 17 and 21 which are adjacent to each other along the word line WL_HQ and the cell plate line CP_HQ and are connected to each other. Therefore, it is not necessary to drive a plurality of word lines WL_HQ and a plurality of cell plate lines CP_HQ in order to select the memory cell 18, so that the reduction in power consumption and the provision of the highly reliable region 8 can be easily simultaneously achieved.

In order to allow bit lines (bit lines BL and XBL) to have the same parasitic capacitance when the normal region 9 is selected, a capacitor addition switch 12 may be provided together with sense amplifiers (A and B in FIG. 6) selected in the memory region 2. In this case, the gate of the capacitor addition switch 12 of a sense amplifier (A in FIG. 6) connected to a bit line BL which is not connected to the memory cell 18 is set to VSS.

Variation of Second Embodiment of the Present Disclosure

Figure 9:
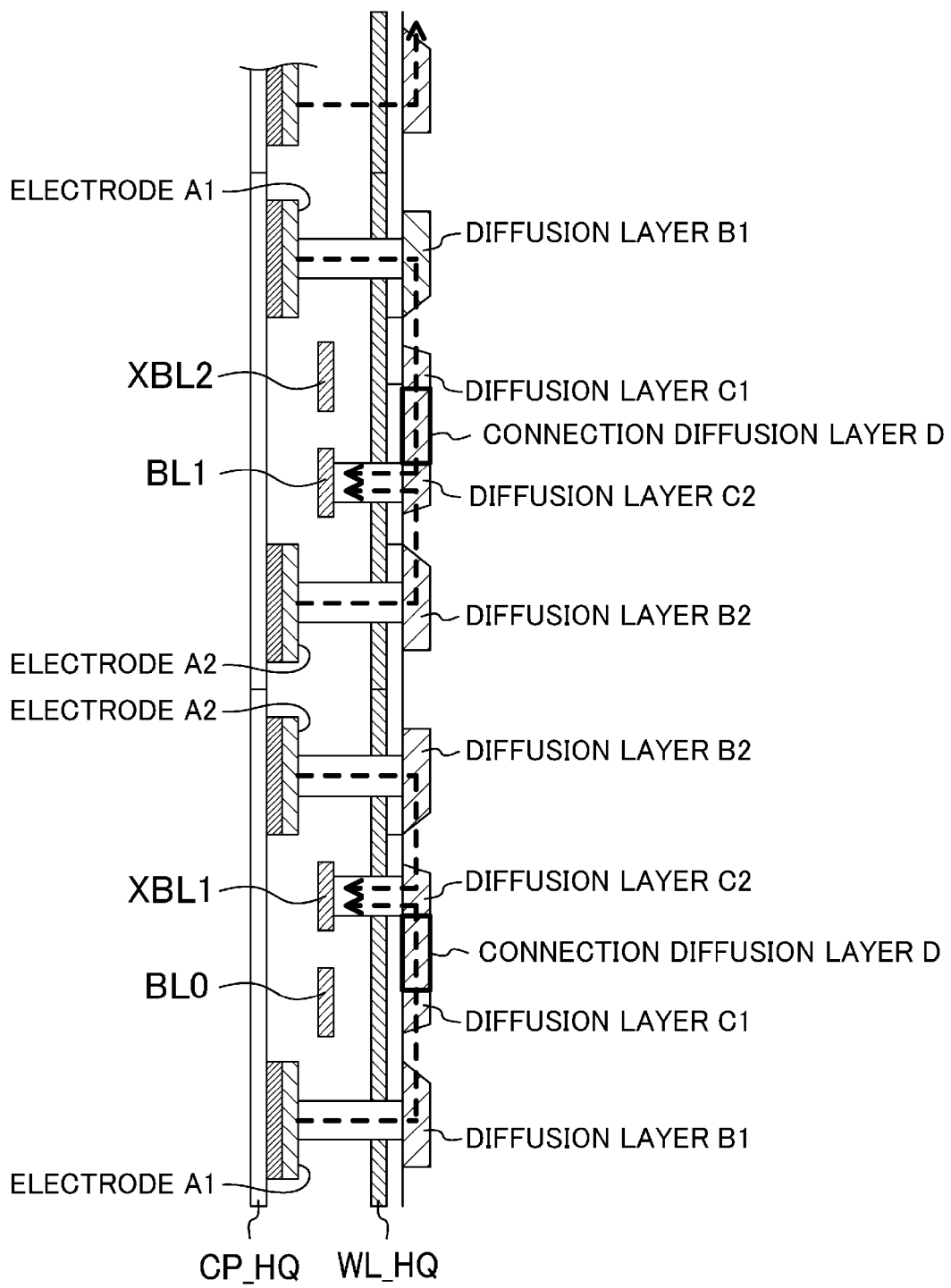
FIG. 9 is a cross-sectional view showing an interconnection structure of a highly reliable region in a variation of the second embodiment.

The cell 17 and the memory cell 18 may be connected via a connection diffusion layer D as shown in FIG. 9 instead of the connection electrode D described above.

Specifically, in the example of FIG. 9, the electrodes A1 included in the charge accumulators of the cells 17 and 21 are connected from the diffusion layers B1 and C1 (transistors) via the connection diffusion layer D to the diffusion layer C2, and are connected to the same bit line BL1 as that to which the electrode A2 is connected. In this case, the same advantage as that described above is obtained, i.e., a memory cell 18 having a capacitance corresponding to the sum of the capacitances of a plurality of cells is selected, and data stored in the memory cell 18 is read and output, as the sum of the voltages of the cells, to bit lines BL and XBL connected to the memory cell 18.

Third Embodiment of the Present Disclosure

Firstly, a configuration according to a third embodiment of the present disclosure will be described.

Figure 10:
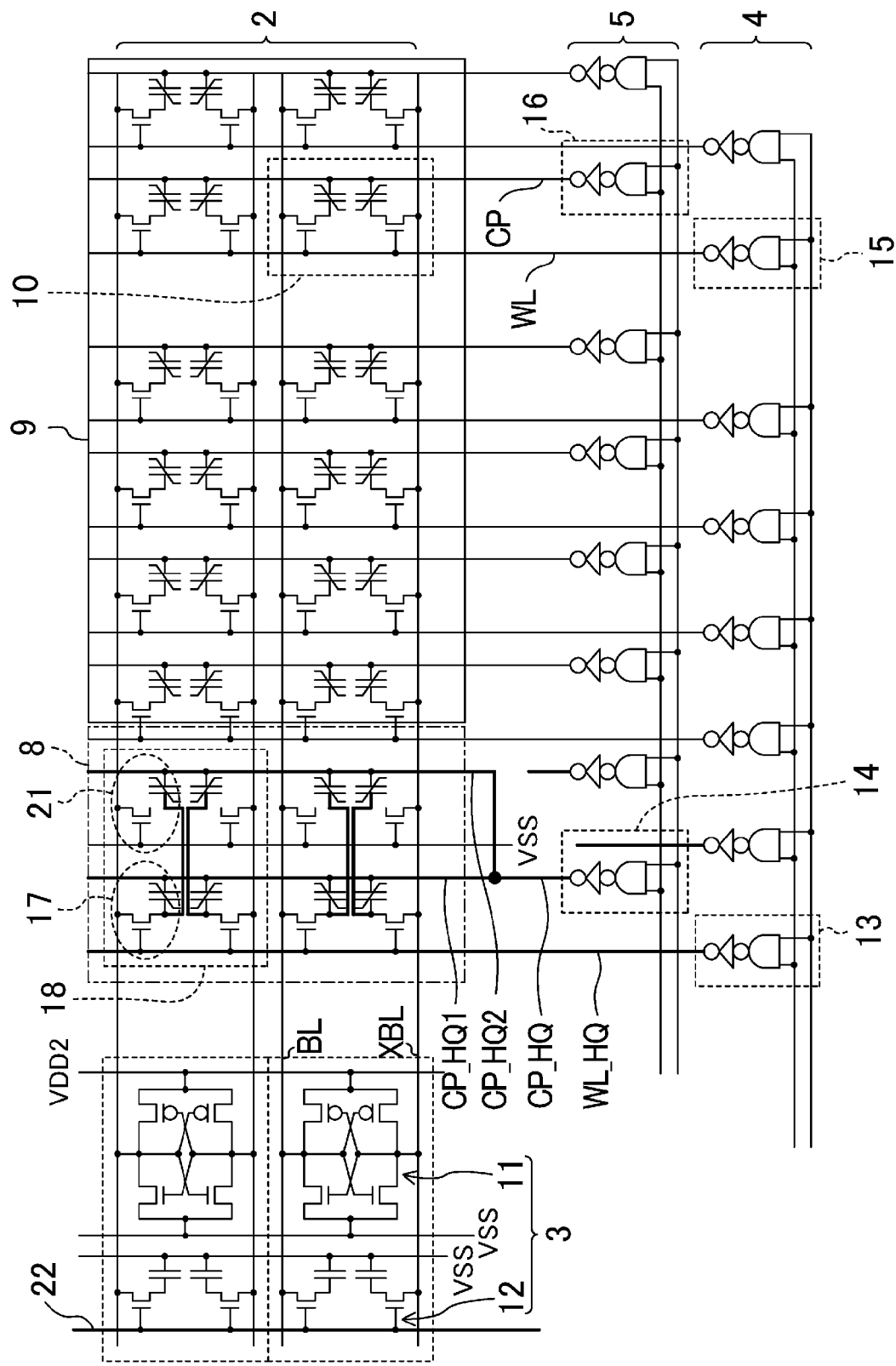
FIG. 10 is a circuit diagram showing a detailed configuration of an FeRAM device according to a third embodiment.

FIG. 10 shows a detailed configuration of the memory region 2, the sense amplifiers 3, the word driver 4, and the cell plate driver 5 of FIG. 1.

The sense amplifiers 3 each include an amplifier circuit 11 which amplifies the potential (data) of a bit line BL connected thereto. The sense amplifier 3 further includes additional capacitors, a capacitor addition switch 12 for connecting an additional capacitor to a bit line BL, and a capacitor addition switch select line 22, in order to switch the parasitic capacitances of the bit line BL so that the different parasitic capacitances are added to the different regions, i.e., the highly reliable region 8 and the normal region 9 of the memory region 2.

This embodiment is different from the first and second embodiments in a technique of selecting a memory cell in the highly reliable region 8.

In this embodiment, one word driver 13 is provided for each word in the highly reliable region 8 of the memory region 2. In the highly reliable region 8, one word line WL_HQ connected to the output of each word driver 13 is used to select memory cells 18. On the other hand, for cell plate lines CP_HQ for selecting memory cells 18, one cell plate driver 14 is provided for each word. In the highly reliable region 8, one cell plate line CP_HQ connected to the output of each cell plate driver 14 is branched into two cell plate lines CP_HQ1 and CP_HQ2 for selecting memory cells 18.

In the normal region 9 of the memory region 2, similar to FIG. 2 one word line WL for selecting memory cells 18 is connected to the output of each word driver 15. Similarly, one cell plate line CP for selecting a memory cell is connected to the output of each cell plate driver 16.

Here, in the memory cell 18 in the highly reliable region 8, the charge accumulators of the cells 17 and 21 adjacent to each other along the bit line BL are directly connected to each other without a switch being connected therebetween.

Figure 11:
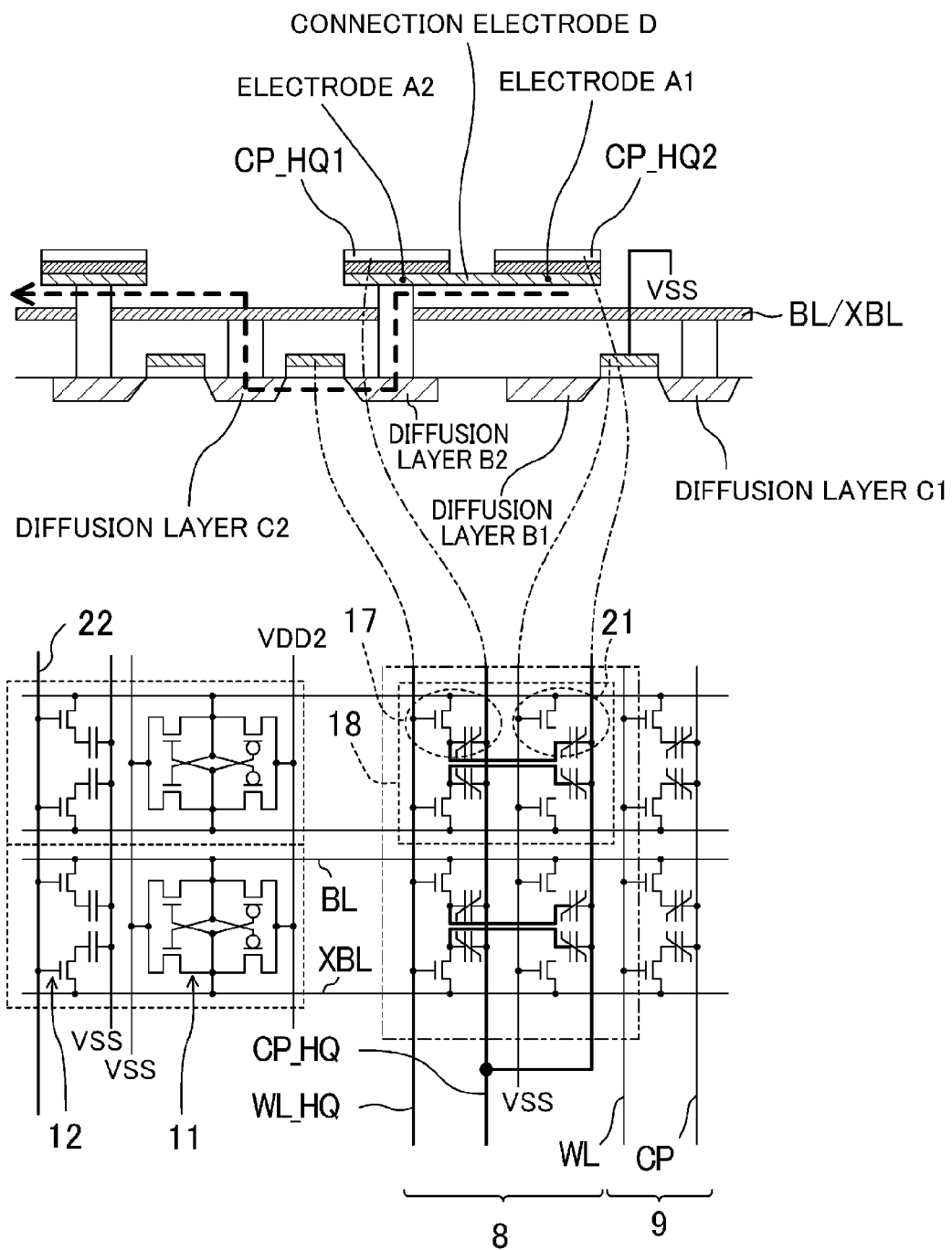
FIG. 11 is a cross-sectional view showing an interconnection structure of a highly reliable region in the FeRAM device of FIG. 10.
Figure 12:
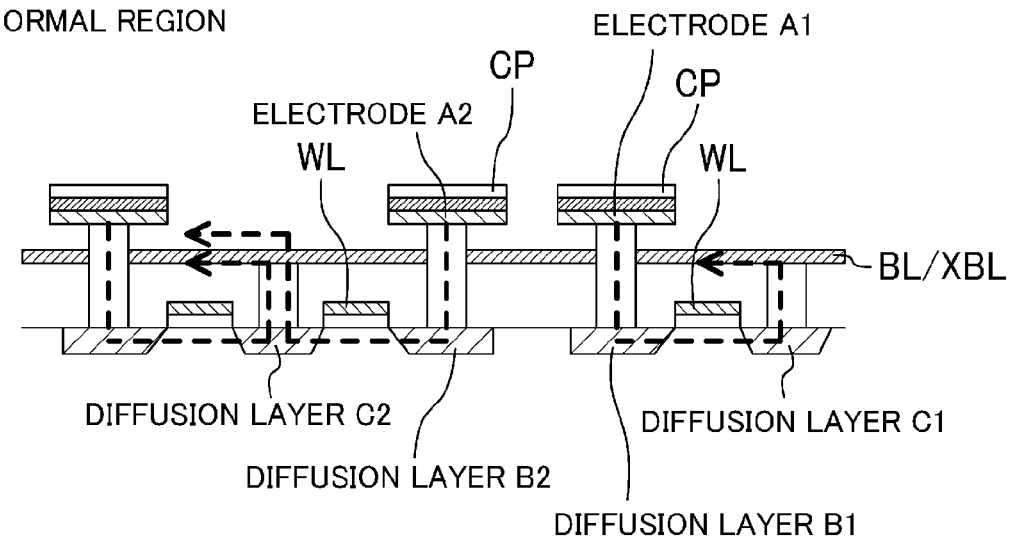
FIG. 12 is a cross-sectional view showing an interconnection structure of a normal region in the FeRAM device of FIG. 10.

FIG. 11 shows a cross-sectional structure of the memory cell 18 having the direct connection. The charge accumulators of the adjacent cells 17 and 21 in the highly reliable region 8 include electrodes A2 and A1 which are connected to each other via a connection electrode D. Specifically, in the normal region 9, the electrodes A2 and A1 are not connected to each other in the structure of the adjacent cells 17 and 21 as shown in FIG. 12, while, in the highly reliable region 8, the memory cell electrodes are shared by the adjacent cells and are connected to each other as shown in FIG. 11. Note that paths through which charge is transferred to a bit line BL are indicated by dashed arrow lines in FIG. 11.

When the normal region 9 is selected, the electrodes A1 included in the charge accumulators are connected via diffusion layers B1 and C1 (transistors) to the bit lines BL and XBL. The electrodes A2 included in the charge accumulators of other cells are connected via diffusion layers B2 and C2 (transistors) to the bit lines BL and XBL Note that the transistors are selectively turned on, and therefore, the electrodes A1 and A2 are not simultaneously connected to the bit lines BL and XBL.

On the other hand, when the highly reliable region 8 is selected, the electrodes A1 and B2 are simultaneously connected via the common diffusion layers B2 and C2 (transistors) to the bit lines BL1 and XBL1 because the electrodes A1 and B2 are connected to each other via the connection electrode D.

Next, data write operation in the normal region 9 and the highly reliable region 8 of the configuration of FIGS. 10-12 will be described.

Write operation performed when the normal region 9 is selected based on an external input address is exactly the same as that of the first embodiment.

When the highly reliable region 8 is selected based on an external input address, one word driver 13 and one cell plate driver 14 in the highly reliable region 8 are activated to output signals WL_HQ and CP_HQ. The signal CP_HQ is branched into signals CP_HQ1 and CP_HQ2 in order to apply a voltage to cell plates included in the charge accumulators of the cells 17 and 21 which are adjacent to each other along the bit line BL and connected to each other. Based on the signals WL_HQ, CP_HQ1, and CP_HQ2, memory cells 18 in the highly reliable region 8 are selected.

External input data is transferred to a sense amplifier 3, and written via a bit line pair BL to a selected memory cell 18. In the memory cell 18 of the highly reliable region 8, two cells 17 and 21 adjacent to each other along the bit line BL are connected to each other as described above. In other words, data is written to the memory cell 18 having a capacitance corresponding to the sum of the capacitances of a plurality of cells (in this case, the same data is written to a plurality of cells 17 and 21 which are connected to the respective bit line pairs BL (bit lines BL and XBL) and are simultaneously selected).

Next, data read operation in the normal region 9 and the highly reliable region 8 of the configuration of FIGS. 10-12 will be described.

Read operation performed when the normal region 9 is selected based on an external input address is exactly the same as that of the first embodiment.

When the highly reliable region 8 is selected based on an external input address, one word driver 13 and one cell plate driver 14 in the highly reliable region 8 are activated to output signals WL_HQ and CP_HQ. The signal CP_HQ is branched into signals CP_HQ1 and CP_HQ2 in order to apply a voltage to cell plates included in the charge accumulators of the cells 17 and 21 which are adjacent to each other along the bit line BL and connected to each other. Based on the signals WL_HQ, CP_HQ1, and CP_HQ2, memory cells 18 in the highly reliable region 8 are selected. The cell 17 in the highly reliable region 8 is connected to the bit line BL via a switching transistor which is driven based on the signal WL_HQ. The cell 21 in the memory cell 18 is connected to the bit line BL via the common switch transistor which connects the cell 17 and the bit line BL together. Here, a word line WL which selects the switch transistor which directly connects the cell 21 and the bit line BL together is set to a potential VSS.

As a result, a memory cell 18 having a capacitance corresponding to the sum of the capacitances of a plurality of cells is selected, and stored data is read and output, as the sum of the voltages of the cells, to the bit lines BL and XBL connected thereto.

Here, the capacitor addition switch 12 is controlled in the same manner as that of the first embodiment.

As a result, for example, even if a high-temperature thermal treatment decreases stored data, a sufficient amount of data to be sensed by a sense amplifier, i.e., a read voltage, can be ensured.

In this configuration, particularly, a memory cell includes two cells which are adjacent to each other along a bit line BL and are connected to each other. Therefore, one word line WL may be used to select memory cells, and a plurality of word lines do not need to be driven, so that the reduction in power consumption and the provision of the highly reliable region 8 can be easily simultaneously achieved.

Variation of Third Embodiment of the Present Disclosure

Figure 13:
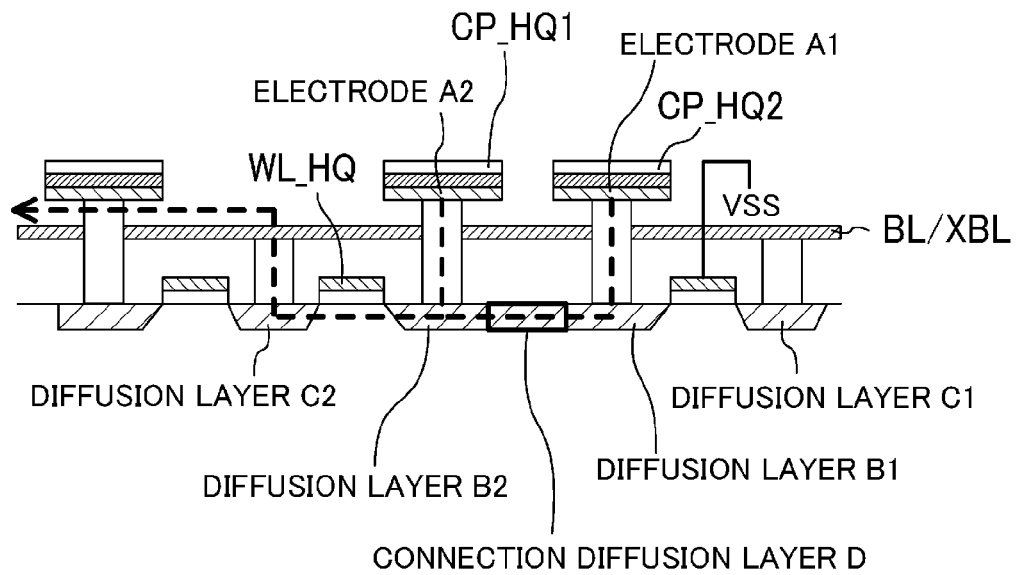
FIG. 13 is a cross-sectional view showing an interconnection structure of a highly reliable region in a variation of the third embodiment.

The cell 17 and the memory cell 18 may be connected via a connection diffusion layer D as shown in FIG. 13 instead of the connection electrode D described above.

Specifically, in the example of FIG. 13, the electrode A1 included in the charge accumulators of the cells 17 and 21 is connected from the diffusion layer B1 via the connection diffusion layer D to the diffusion layer B2, and are thereby connected to the electrode A2. The electrodes A1 and A2 are connected via the common diffusion layers B2 and C2 (transistors) to the bit lines BL and XBL. In this case, the same advantage as that described above is obtained, i.e., a memory cell 18 having a capacitance corresponding to the sum of the capacitances of a plurality of cells is selected, and data stored in the memory cell 18 is read and output, as the sum of the voltages of the cells, to bit lines BL and XBL connected to the memory cell 18.

Fourth Embodiment of the Present Disclosure

Firstly, a configuration according to a fourth embodiment of the present disclosure will be described.

Figure 14:
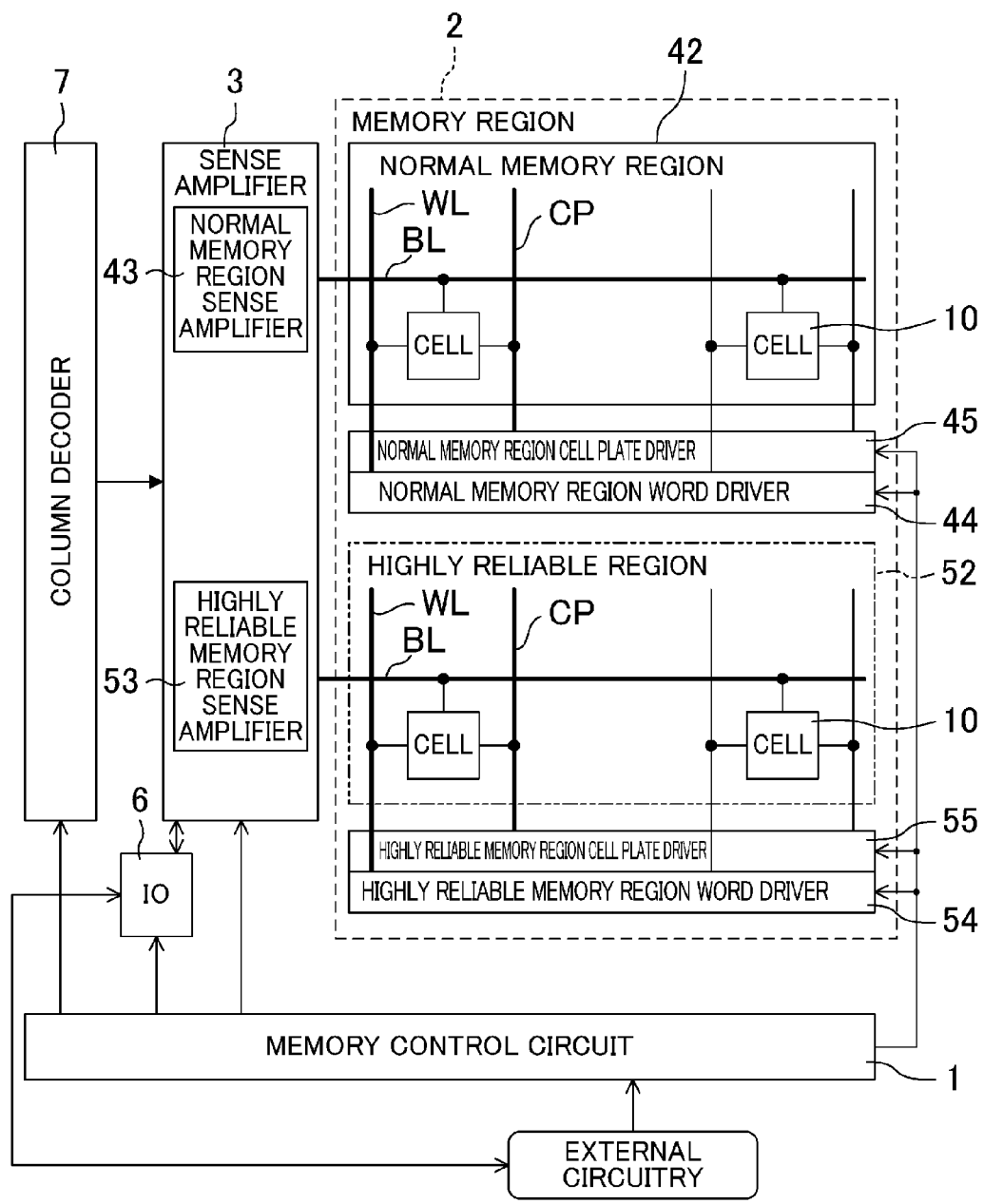
FIG. 14 is a block diagram schematically showing a configuration of an FeRAM device according to a fourth embodiment.

FIG. 14 shows a configuration of functional blocks in an FeRAM device according to the fourth embodiment of the present disclosure.

This embodiment includes a memory control circuit 1 (including an address input circuit), a memory region 2, sense amplifiers 3, an I/O circuit 6, and a column decoder 7.

The memory region 2 includes a normal memory region 42 and a highly reliable memory region 52.

The sense amplifiers 3 include normal memory region sense amplifiers 43 and highly reliable memory region sense amplifiers 53. For example, the highly reliable memory region sense amplifier 53 may include, similar to the first, second, or third embodiment, an additional capacitor, a capacitor addition switch for connecting the additional capacitor to a bit line BL, and a capacitor addition switch select line.

Here, in particular, compared to the normal memory region sense amplifier 43, the highly reliable memory region sense amplifier 53 has an amplifier circuit which has a longer transistor gate length and width and therefore can detect a smaller potential difference.

The normal memory region 42 includes a normal memory region word driver 44 and a normal memory region cell plate driver 45 in addition to the dedicated normal memory region sense amplifier 43.

The highly reliable memory region 52 includes a highly reliable memory region word driver 54 and a highly reliable memory region cell plate driver 55 in addition to the dedicated highly reliable memory region sense amplifier 53.

The memory control circuit 1 (including an address input circuit), the I/O circuit 6, and the column decoder 7 have the functions described in the first embodiment.

The normal memory region 42 and the highly reliable memory region 52 included in the memory region 2 have a configuration similar to that of the normal region 9 and the highly reliable region 8 described in the first, second, or third embodiment.

Next, operation of this embodiment will be described.

Data write operation and data read operation of this embodiment are similar to those described in the first, second, or third embodiment.

In this configuration, in particular, a large voltage (potential difference) is added to the bit line BL in the highly reliable memory region 52, and in addition, the highly reliable memory region sense amplifier 53 which senses this data has a large operation margin, whereby a higher data storing capability is obtained.

Note that, by using, for the highly reliable memory region sense amplifier 53, a dedicated power supply which supplies a power supply voltage different from that for the normal memory region sense amplifier 43, a small potential difference can be more easily sensed.

Fifth Embodiment of the Present Disclosure

A fifth embodiment of the present disclosure will be described hereinafter with reference to the drawings.

Figure 15:
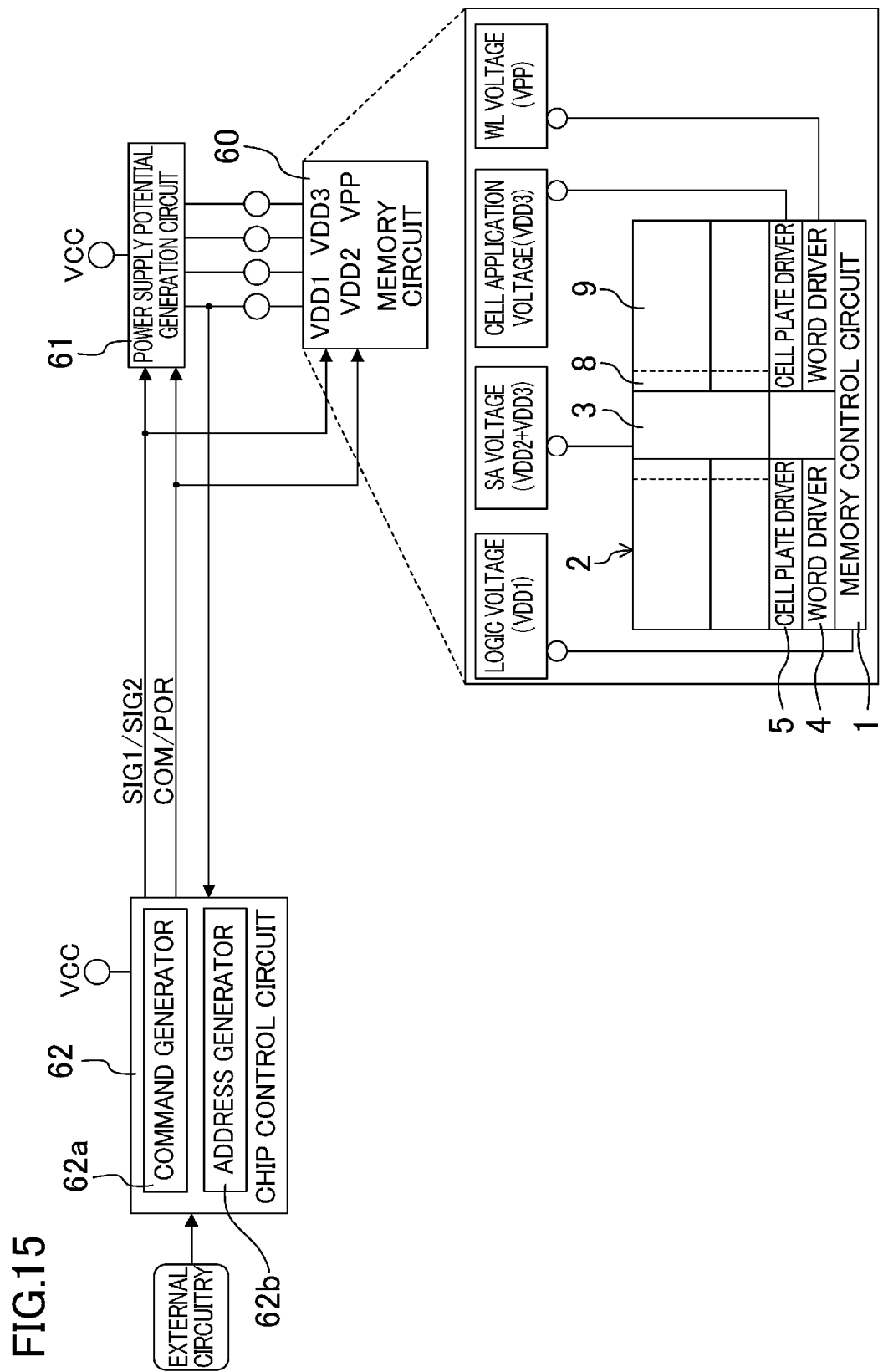
FIG. 15 is a block diagram schematically showing a configuration of a semiconductor integrated device according to a fifth embodiment.

FIG. 15 shows a configuration of a semiconductor integrated circuit including a non-volatile semiconductor memory device according to the fifth embodiment of the present disclosure.

The semiconductor integrated circuit includes: a memory circuit 60 including a memory region 2 having a highly reliable region 8 and a normal region 9; a power supply potential generation circuit 61 which supplies a power supply potential to the memory circuit 60; and a chip control circuit 62 which has a command generator 62a and an address generator 62b, and supplies, to the memory circuit 60 and the power supply potential generation circuit 61, a command COM for instructing them to perform operation and an address signal for indicating an operation target.

In particular, the memory circuit 60 has a configuration similar to that of any of the first to fourth embodiments, and further has the following features.

Figure 16:
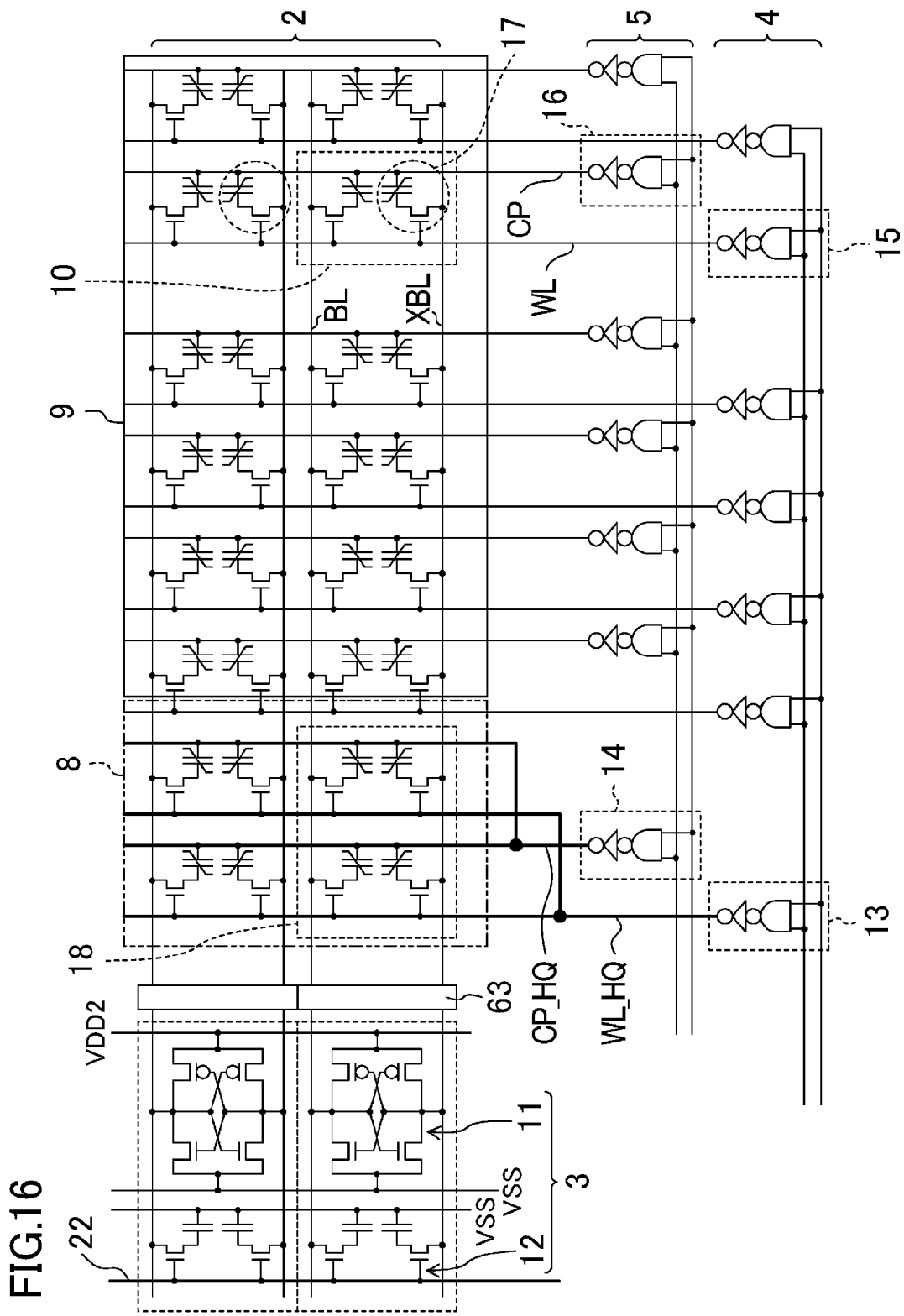
FIG. 16 is a circuit diagram showing a detailed configuration of an FeRAM device in the semiconductor integrated device of FIG. 15.

Specifically, as shown in FIG. 16, the memory circuit 60 includes the sense amplifier 3 which includes an amplifier circuit 11 which amplifies data read from a memory cell 10 or 18 and a data write circuit 63 which writes data to a memory cell 10 or 18 via a bit line BL.

The amplifier circuit 11 operates based on a power supply potential VDD2, and the data write circuit 63 operates based on a power supply potential VDD3.

The maximum potential of a cell plate line signal (signal CP) which is a signal for selecting memory cells 10 or 18 and reading data from the memory cells 10 or 18 is equal to the power supply potential VDD3. Cell plate drivers 14 and 16 which generate the cell plate line signal operate based on the power supply potential VDD3.

The maximum potential of a word line signal (signal WL) which is a signal for switching a switch provided between a memory cell and a bit line BL to select the memory cell is equal to the power supply potential VPP. Word drivers 13 and 15 which generate the word line signal operate based on the power supply potential VPP.

The memory control circuit 1 which controls the sense amplifier 3, the cell plate drivers 14 and 16, and the word drivers 13 and 15 based on a command and an address from external circuitry operates based on a power supply potential VDD1.

A method for operating this configuration will be described hereinafter.

When the external circuitry designates the normal region 9 as an operation target, a region designation signal SIG1 is transferred from the chip control circuit 62 to the power supply potential generation circuit 61. In this case, as shown in FIG. 17, potentials for normal operating specifications are output as VDD1, VDD2, VDD3, and VPP, and the sections of the memory circuit 60 operate at these potentials.

When the external circuitry designates the highly reliable region 8 as an operating target, a region designation signal SIG2 is transferred from the chip control circuit 62 to the power supply potential generation circuit 61. In this case, potentials different from those for normal operating specifications are output as VDD1, VDD2, VDD3, and VPP, and the sections of the memory circuit 60 operate based on these potentials. Specifically, VDD2 is set to a low voltage (e.g., a specified minimum potential or a still lower potential), and VDD3 and VPP are set to a high voltage (e.g., a specified maximum potential or a still higher potential), and these potentials are transferred from the power supply potential generation circuit 61 to the memory circuit 60.

Next, data write operation of this embodiment will be described.

Initially, the memory control circuit 1 operates at the power supply potential VDD1 based on the command COM and the address which are input from the chip control circuit 62, to output an activation signal to the word driver 4 and the cell plate driver 5. The cell plate driver 5 operates at a high voltage to output a high-potential signal CP in order to apply a higher voltage to memory cells 10 or 18 to temporarily read data stored in the memory cells 10 or 18. The word driver 4 operates at a high voltage (VDD2+the threshold potential (Vt) of the switch transistor) to output a signal WL having this potential in order to sufficiently output data stored in a memory cell 10 or 18 to a bit line BL. Memory cells 10 or 18 are selected based on the signals WL and CP. Data written in a selected memory cell 10 or 18 is read out as a voltage and output to a bit line BL. The data is transferred to a sense amplifier 3 connected to the bit line BL. When amplifying this voltage, the sense amplifier 3 operates at a potential lower than that which is normally used. As a result, the sense amplifier 3 can correctly sense a small potential read from a bit line BL and operate, to store data.

On the other hand, external input write data is transferred via an I/O section to the amplifier circuit 11 of a sense amplifier 3 which has been selected by a column decoder based on an input address, and replaces read data which has been previously stored. Thereafter, the power supply potential VDD3 of the data write circuit 63 in the sense amplifier 3 transitioned to a high potential so that the write data is transferred and written via a bit line BL to a memory cell 10 or 18. The data write circuit 63 operating at the high potential VDD3 transfers the write data via the bit line BL to the memory cell 10 or 18 (transfer destination) which have been selected based on the high-potential signals WL and CP. The write data is written at a high potential to the memory cell 10 or 18.

Next, data read operation in this embodiment will be described.

The memory control circuit operates at the power supply potential VDD1 based on the command COM and address input from the chip control circuit 62, to output an activation signal to the word driver 4 and the cell plate driver 5. The cell plate driver 5 operates at a high voltage to output a high-potential signal CP in order to apply a higher voltage to memory cells 10 or 18 to temporarily read data stored in the memory cells 10 or 18. The word driver 4 operates at a high voltage (VDD2+the threshold potential (Vt) of the switch transistor) to output a signal WL having this potential in order to sufficiently output data stored in a memory cell 10 or 18 to a bit line BL. Memory cells 10 or 18 are selected based on the signals WL and CP. Data written in a selected memory cell 10 or 18 is read out as a voltage and output to a bit line BL. The data is transferred to a sense amplifier 3 connected to the bit line BL. When amplifying this voltage, the sense amplifier 3 operates at a potential lower than that which is normally used. As a result, the sense amplifier 3 can correctly sense a small potential read from a bit line BL and operate, to store data.

Next, the column decoder 7 selects the amplifier circuit 11 of a sense amplifier 3 based on an input address. The selected amplifier circuit 11 transfers read data which has been previously stored therein to the I/O circuit which operates at the power supply potential VDD1. The read data is output via the I/O circuit to the external circuitry.

In parallel with this, the read data stored in the sense amplifier 3 is transferred and written back via the bit line BL to the memory cell 10 or 18. In this case, the power supply potential VDD3 of the data write circuit 63 in the sense amplifier 3 also transitions to a high potential. The data write circuit 63 operating at the high potential VDD3 transfers the write data via the bit line BL to the memory cell 10 or 18 (transfer destination) which have been selected based on the high-potential signals WL and CP. The write data is written at a high potential to the memory cell 10 or 18.

Thus, the operating voltage of the memory circuit 60 is optimized when instructing the highly reliable region 8 to operate so that a high voltage (VDD2) is applied to a cell during both read and write operations, and a sense amplifier voltage (VDD2) is low during read operation, whereby the data storage characteristic in the region can be dramatically improved.

Here, in particular, for example, it is more effective to instruct the highly reliable region 8 to operate when the semiconductor integrated circuit is turned on.

The highly reliable region 8 may store basic data for defining operation of the memory circuit 60 and the entire chip and data for security authentication, whereby the use of this region has a higher priority. Because of their specificity, these data items are not often rewritten after being once stored. Also, the data items are required during the start of operation. Therefore, as a use condition, the data items more often need to be read and input when the memory circuit 60 is turned on.

In this case, the chip control circuit 62 may have a power supply potential sensing function.

The chip control circuit 62 may monitor the potential of the external power supply VCC to determine whether or not the chip has been turned on, and when the chip has been turned on, transfers a command signal POR to the memory circuit 60 and the power supply potential generation circuit 61. The memory circuit 60, when receiving POR, sets the highly reliable region 8 to be an operating region. The power supply potential generation circuit 61 sets the power supply potentials (generated potentials) VDD1, VDD2, VDD3, and VPP to potentials at which the sense amplifier can sense read data with high sensitivity in order to increase the amount of read data of the memory cell 18 (increase the potential of the bit line BL) and increase the amount of stored data (charge) during rewrite operation as described above.

As a result, the data storage characteristic of the highly reliable region 8 can be improved by the highly reliable region 8 being handled in this manner every time the memory circuit 60 is turned on.

Although, in the above embodiments, FeRAM has been described as example non-volatile semiconductor memory, the present disclosure is also applicable to other non-volatile memory and volatile memory, such as SRAM and DRAM. Also in this case, the amount (voltage) of read data can be increased, so that the data storage characteristic can be improved, the circuit area can be reduced, etc.

The components described in the above embodiments and variations may be combined in various manners as long as the combination is logically appropriate. Specifically, for example, the 1T1C (one transistor and one capacitor) etc. described in the first embodiment may be applied to each of the other embodiments.

In the semiconductor memory device of the present disclosure, for example, the area of a region where data is not lost due to, for example, high-temperature treatment stress can be reduced by the reduction in the decoding circuit, and variations in cell characteristic due to the use of cells having the same size as that of normal cells, can be reduced. Therefore, for example, the reduction in power consumption and the sufficient amount (voltage) of read data can be simultaneously achieved to guarantee data storage. Therefore, the present disclosure is particularly useful for semiconductor memory devices, such as non-volatile semiconductor memory devices which need to store high-security data, etc.

What is claimed is:
1. A semiconductor memory device comprising:
a plurality of memory cells connected to a common bit line;
a plurality of select lines each configured to select at least one of the memory cells;
a plurality of drive circuits each configured to drive at least one of the select lines; and
a sense amplifier configured to amplify a voltage occurring at the bit line depending on data stored in the selected memory cell, wherein
a memory region where the memory cells are provided has a first region and a second region;
when the first region is read, a larger number of the select lines are simultaneously driven by the corresponding common drive circuit than those in the second region, and a larger number of the memory cells are simultaneously selected than those in the second region, and
the voltage occurring at the common bit line depending on data stored in the simultaneously selected memory cells is amplified by the sense amplifier.

2. The semiconductor memory device of claim 1, wherein the select lines simultaneously driven are connected to each other via a single diffusion layer.

3. The semiconductor memory device of claim 1, wherein the select lines simultaneously driven are connected to each other via a plurality of diffusion layers.

4. The semiconductor memory device of claim 1, wherein the common drive circuit simultaneously driving the select lines includes a single drive element.

5. A semiconductor memory device comprising:
a plurality of memory cells connected to a common bit line;
a plurality of select lines each configured to select at least one of the memory cells;
a plurality of drive circuits each configured to drive at least one of the select lines; and
a sense amplifier configured to amplify a voltage occurring at the bit line depending on data stored in the selected memory cell,
wherein
a memory region where the memory cells are provided has a first region and a second region;
when the first region is read, a larger number of the memory cells connected to the common bit line are selected by a single one of the select lines driven by the corresponding drive circuit than those in the second region, and
the voltage occurring at the common bit line depending on data stored in the simultaneously selected memory cells is amplified by the sense amplifier.

6. The semiconductor memory device of claim 5, wherein the memory cells each include a charge accumulator including a pair of electrodes and configured to accumulate charge depending on data to be stored, and
first ones of the electrodes of the charge accumulators of the simultaneously selected memory cells are connected together, and are connected to the common bit line via a common transistor driven by the single select line.

7. The semiconductor memory device of claim 5, wherein the memory cells each include a charge accumulator including a pair of electrodes and configured to accumulate charge depending on data to be stored, and a transistor configured to be driven by the single select line, and
first ones of the electrodes of the charge accumulators of the simultaneously selected memory cells are connected via the respective transistors to the common bit line.

8. The semiconductor memory device of claim 5, wherein a larger number of the memory cells are selected by the single select line than those in the second region, where storage nodes of the larger number of memory cells are connected together.

9. The semiconductor memory device of claim 5, wherein a larger number of the memory cells are selected by the single select line than those in the second region, where electrode portions of the larger number of memory cells are connected together.

10. The semiconductor memory device of claim 5, wherein the memory cells each include a charge accumulator including a pair of electrodes and configured to accumulate charge depending on data to be stored,
voltage application lines are provided to apply a predetermined voltage to first ones of the electrodes of the charge accumulators, and
the number of the select lines is the same as the number of the voltage application lines.

11. The semiconductor memory device of claim 5, wherein the memory cells each include a charge accumulator including a pair of electrodes and configured to accumulate charge depending on data to be stored,
voltage application lines are provided to apply a predetermined voltage to first ones of the electrodes of the charge accumulators, and
the number of the voltage application lines is larger than the number of the select lines.

12. The semiconductor memory device of claim 5, wherein the simultaneously selected memory cells are adjacent to each other in a direction of the select line.

13. The semiconductor memory device of claim 5, wherein the simultaneously selected memory cells are adjacent to each other in a direction of the bit line.

14. A semiconductor memory device comprising:
a plurality of memory cells connected to a common bit line;
a plurality of select lines each configured to select at least one of the memory cells; and
a plurality of drive circuits each configured to drive at least one of the select lines,
wherein
a memory region where the memory cells are provided has a first region and a second region;
the semiconductor memory device further includes a first and a second sense amplifier corresponding to the first and second regions, respectively, where the first and second sense amplifiers are each configured to amplify a voltage occurring at the bit line depending on data stored in the selected memory cell, and
the first and second sense amplifiers have different difference potential detection capabilities.

15. The semiconductor memory device of claim 14, wherein
the first and second sense amplifiers each include a transistor, and
the gate length and gate width of the transistor of the first sense amplifier are longer than the gate length and gate width of the second sense amplifier, respectively.

16. The semiconductor memory device of claim 1, wherein when data stored in the memory cell is read out, the capacitance of the bit line is increased.

17. The semiconductor memory device of claim 16, wherein when data stored in the memory cell is read out, an additional capacitor is connected to the bit line.

18. A semiconductor integrated device comprising:
the semiconductor memory device of claim 1; and
a control circuit configured to select one of the first and second regions as a target for write operation and read operation of stored data, and control the write operation and the read operation.

19. The semiconductor integrated circuit of claim 18, further comprising:
a power supply circuit configured to supply a power supply potential to the semiconductor memory device,
wherein
the control circuit controls the power supply circuit so that the power supply potential supplied to the semiconductor memory device is changed, depending on which of the first and second regions is selected.

20. The semiconductor integrated circuit of claim 18, wherein the first region is selected when the semiconductor integrated circuit is turned on.

21. The semiconductor memory device of claim 1, wherein the memory cells in the first and second regions are made of a ferroelectric material.

* * * * *